(12) United States Patent
Al-Shyoukh

(10) Patent No.: US 12,294,335 B2
(45) Date of Patent: *May 6, 2025

(54) RECEIVER FRONT END FOR DIGITAL ISOLATORS

(71) Applicant: Skyworks Solutions, Inc., Irvine, CA (US)

(72) Inventor: Mohammad Al-Shyoukh, Cedar Park, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 538 days.

This patent is subject to a terminal disclaimer.

(21) Appl. No.: 17/582,145

(22) Filed: Jan. 24, 2022

(65) Prior Publication Data

US 2022/0149788 A1 May 12, 2022

Related U.S. Application Data

(63) Continuation of application No. 16/528,065, filed on Jul. 31, 2019, now Pat. No. 11,233,482.

(51) Int. Cl.
*H03F 3/45* (2006.01)
*H03F 1/02* (2006.01)
*H04B 1/16* (2006.01)

(52) U.S. Cl.
CPC ....... *H03F 1/0288* (2013.01); *H03F 3/45475* (2013.01); *H04B 1/16* (2013.01);
(Continued)

(58) Field of Classification Search
CPC ............. H03F 3/45; H03F 3/105; H04B 1/16
(Continued)

(56) References Cited

U.S. PATENT DOCUMENTS 4,570,128 A 2/1986 Monticelli
7,902,627 B2 3/2011 Dong et al.
(Continued)

FOREIGN PATENT DOCUMENTS

CN 109246160 B 1/2022

OTHER PUBLICATIONS

Electronics-Tutorials, "Input Impedance of an Amplifier," downloaded from https://www.electronics-tutorials.ws/amplifier/input-impedance-of-an-amplifier.html, May 10, 2019, 11 pages.
(Continued)

*Primary Examiner* — Henry Choe
(74) *Attorney, Agent, or Firm* — Knobbe, Martens, Olson & Bear, LLP

(57) ABSTRACT

In at least one embodiment, a method for operating a receiver includes configuring a receiver front-end circuit of the receiver according to a selected power consumption configuration. The method includes adjusting a quiescent current of a programmable flat gain stage coupled to the receiver front-end circuit according to the selected power consumption configuration to compensate for any gain loss of the receiver front-end circuit in the selected power consumption configuration. The selected power consumption configuration may be a reduced power consumption configuration and the programmable flat gain stage may be configured to at least partially compensate for the gain loss of the receiver front-end circuit in the reduced power consumption configuration.

18 Claims, 15 Drawing Sheets

(52) U.S. Cl.
CPC .............. *H03F 2203/45604* (2013.01); *H03F 2203/45631* (2013.01); *H03F 2203/45694* (2013.01)

(58) Field of Classification Search
USPC .................................................. 330/254, 311
See application file for complete search history.

(56) References Cited

U.S. PATENT DOCUMENTS

| | | | |
|---|---|---|---|
| 8,023,591 B2* | 9/2011 | Hafizi | H04B 1/30 455/325 |
| 8,169,108 B2 | 5/2012 | Dupuis et al. | |
| 8,198,951 B2 | 6/2012 | Dong et al. | |
| 8,441,325 B2 | 5/2013 | Callahan et al. | |
| 8,478,332 B2 | 7/2013 | Giombanco et al. | |
| 9,564,863 B1 | 2/2017 | Giridharan | |
| 9,634,646 B1 | 2/2017 | Ha | |
| 9,755,599 B2 | 9/2017 | Yuan et al. | |
| 9,929,854 B2 | 3/2018 | Laughlin et al. | |
| 10,326,375 B1 | 6/2019 | Pentakota et al. | |
| 10,840,960 B1 | 11/2020 | Al-Shyoukh | |
| 10,942,217 B2 | 3/2021 | Al-Shyoukh et al. | |
| 11,233,482 B2* | 1/2022 | Al-Shyoukh | H03F 3/45237 |
| 11,456,708 B1* | 9/2022 | Rattan | H03F 3/16 |
| 11,750,231 B2* | 9/2023 | Briseno-Vidrios | H03K 19/017509 327/565 |
| 2001/0041548 A1 | 11/2001 | Bult | |
| 2003/0218502 A1 | 11/2003 | MacTaggart et al. | |
| 2004/0219898 A1 | 11/2004 | Bult | |
| 2005/0285674 A1 | 12/2005 | Zaguri | |
| 2008/0139149 A1 | 6/2008 | Mu et al. | |
| 2010/0141340 A1 | 6/2010 | Huang et al. | |
| 2013/0027110 A1 | 1/2013 | Beale | |
| 2013/0207722 A1 | 8/2013 | Bulzacchelli | |
| 2013/0286864 A1 | 10/2013 | Karam | |
| 2015/0288144 A1 | 10/2015 | Raj et al. | |
| 2016/0080183 A1 | 3/2016 | Yun et al. | |
| 2018/0323759 A1 | 11/2018 | Cojocaru | |
| 2018/0348295 A1 | 12/2018 | Stroud et al. | |
| 2019/0068410 A1 | 2/2019 | Al-Shyoukh et al. | |
| 2019/0068417 A1 | 2/2019 | Rehman et al. | |
| 2019/0181817 A1 | 6/2019 | Al-Shyoukh et al. | |

OTHER PUBLICATIONS

Lafevre, K., "Design of a Modified Cherry-Hooper Transimpedance Amplifier with DC Offset Cancellation," Arizona State University, Aug. 2011, 64 pages.

* cited by examiner

RECEIVER FRONT END FOR DIGITAL ISOLATORS

CROSS-REFERENCE TO RELATED APPLICATION(S)

This application is a continuation of U.S. patent application Ser. No. 16/528,065, filed Jul. 31, 2019, entitled "Receiver Front End for Digital Isolators," naming Mohammad Al-Shyoukh as inventor, which application is incorporated herein by reference in its entirety.

This application is related to U.S. patent application Ser. No. 16/528,059, filed Jul. 31, 2019, now U.S. Pat. No. 10,840,861, entitled "RECEIVER INTERMEDIATE VARIABLE GAIN STAGE FOR ISOLATOR PRODUCTS," naming Mohammad Al-Shyoukh as inventor, and is related to U.S. patent application Ser. No. 16/528,075, filed Jul. 31, 2019, now U.S. Pat. No. 10,840,960, entitled "DEMODULATOR/DETECTOR FOR DIGITAL ISOLATORS," naming Mohammad Al-Shyoukh as inventor, and is related to U.S. patent application Ser. No. 16/528,256, filed Jul. 31, 2019, now U.S. Pat. No. 10,942,217, entitled "CALIBRATION OF DIGITAL ISOLATORS," naming Mohammad Al-Shyoukh and Peter Onody as inventors, all of which applications are incorporated herein by reference in their entirety.

BACKGROUND

Field of the Invention

The invention relates to isolation technology and more particularly to an isolation product including a communications channel across an isolation barrier.

Description of the Related Art

In a typical control application, a processor system provides one or more control signals for controlling a load system. During normal operation, a large DC or transient voltage difference may exist between the power domain of the processor system and the power domain of the load system, thus requiring an isolation barrier between the processor system and the load system. For example, one domain may be grounded at a voltage that is switching with respect to earth ground by hundreds or thousands of volts. In other control applications (e.g., medical applications) the expected voltage difference between the power domains is relatively small in normal operation, however, isolation increases safety.

Accordingly, an intermediate system includes isolation that prevents damaging currents from flowing between the processor system and the load system. Although the isolation prevents the processor system from being coupled to the load by a direct conduction path, an isolation channel allows communication between the two systems using optical (opto-isolators), capacitive, inductive (transformers), or electromagnetic techniques. However, such communication is susceptible to common mode transient events that can interfere with the accuracy of the information transmitted across the isolation channel. In addition, isolation channel communication may be used in various applications having different power consumption specifications. Thus, an isolation channel that reliably communicates information across an isolation barrier with selectable power consumption and immunity to common mode transients is desirable.

SUMMARY OF EMBODIMENTS OF THE INVENTION

In at least one embodiment, a method for operating a receiver includes configuring a receiver front-end circuit of the receiver according to a selected power consumption configuration. The method includes adjusting a quiescent current of a programmable flat gain stage coupled to the receiver front-end circuit according to the selected power consumption configuration to compensate for any gain loss of the receiver front-end circuit in the selected power consumption configuration. The selected power consumption configuration may be a reduced power consumption configuration and the programmable flat gain stage may be configured to at least partially compensate for the gain loss of the receiver front-end circuit in the reduced power consumption configuration.

In at least one embodiment, a receiver includes a receiver front-end circuit configured according to a selected power consumption configuration. The receiver includes a variable peaking gain stage including a programmable flat gain stage and a peaking gain stage. The programmable flat gain stage is configured to have a gain according to the selected power consumption configuration and the peaking gain stage is configured according to the selected power consumption configuration. The selected power consumption configuration may be a reduced power consumption configuration and the programmable flat gain stage may be configured to at least partially compensate for a gain loss of the receiver front-end circuit in the reduced power consumption configuration.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
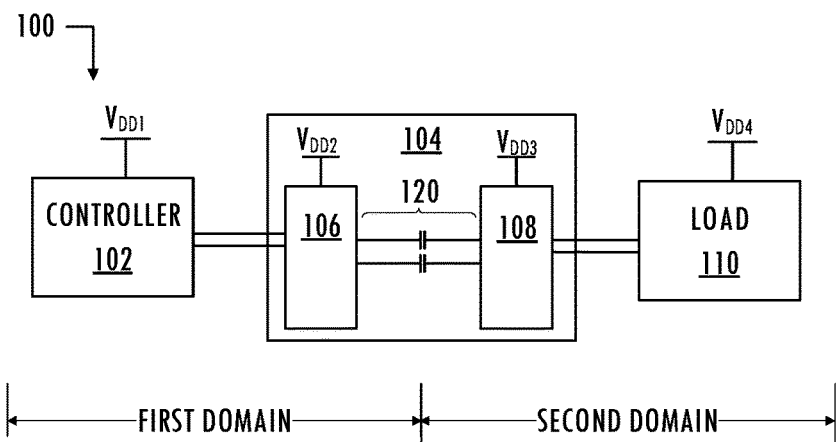
FIG. 1 illustrates a functional block diagram of an exemplary control system including an isolator product.
Figure 2:
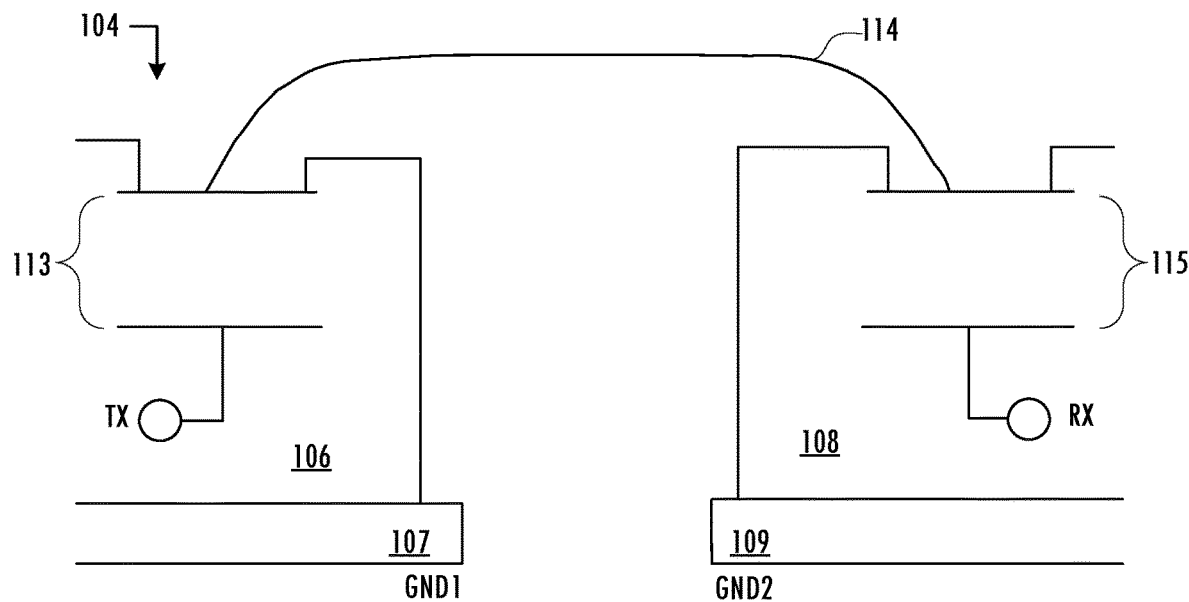
FIG. 2 illustrates a cross-sectional view of an exemplary packaged isolator product including a capacitive isolation barrier.

Referring to FIGS. 1 and 2, in an exemplary control application, controller 102, which may be a microprocessor, microcontroller, or other suitable processing device, operates in a first domain (i.e., a voltage domain including $V_{DD1}$, e.g., 5 Volts (V)) and communicates with load system 110 operating in a second domain (i.e., a domain including $V_{DD4}$, e.g., 150V) using isolator 104. Isolator 104 preserves isolation between the domains on a first side of system 100, e.g., the first domain including $V_{DD1}$ (e.g., less than ten volts) and $V_{DD2}$ (e.g., less than ten volts) and devices coupled thereto, and a second side of system 100, e.g., the second domain including $V_{DD3}$ (e.g., tens of volts) and $V_{DD4}$ (e.g., hundreds of volts) and devices coupled thereto. For example, the first and second domains of isolator 104 are physically separate while isolator 104 provides a reliable communications channel between the first and second domains. The voltage rating of an isolator refers to how much voltage an isolator can withstand between a first ground of a first domain and a second ground of a second domain before breaking down.

Isolation channel 120 facilitates safe communication of a signal received from controller 102 in the first domain across an isolation barrier to load 110 of the second domain. The second domain includes driver circuitry (e.g., included in integrated circuit die 108) that generates an output control signal based on the signal received from the first domain and provides a suitable drive signal to load 110. In an exemplary embodiment of isolator 104, integrated circuit die 106 is attached to lead frame 107 and integrated circuit die 108 is attached to lead frame 109. Each integrated circuit die includes integrated circuit terminals coupled to isolation channel 120 and are packaged as a single device. In general, an integrated circuit terminal (e.g., a contact pad or bond pad) is formed from one or more conductors (e.g., gold, silver, copper, aluminum, polysilicon, or combination thereof) on an insulating layer that includes conductive vias that electrically couple the integrated circuit terminal to circuitry on the integrated circuit die below the insulating layer. Isolation channel 120 allows safe communication of signals from controller 102 to load 110 via integrated circuit die 106 and integrated circuit die 108. Similarly, isolator 104 may safely provide at least one feedback signal from load 110 to controller 102 via isolation channel 120.

In at least one embodiment of system 100, isolation channel 120 blocks DC signals and only passes AC signals. Isolation channel 120 is described as including capacitive isolation, although other suitable isolation techniques may be used. Capacitor 113 and capacitor 115 may be integrated with integrated circuit die 106 and integrated circuit die 108, respectively, and coupled to each other via bond wire 114. Capacitor 113 and capacitor 115 may each include a bottom plate formed in a first conductive semiconductor layer (e.g., metal-1), a top plate formed in a second conductive semiconductor layer (e.g., metal-7) above the first conductive semiconductor layer, and a dielectric material (e.g., silicon dioxide) formed between the top and bottom plates.

An exemplary isolation channel 120 uses digital modulation (e.g., on-off keying modulation) to communicate one or more digital signals between integrated circuit die 106 and integrated circuit die 108, although other communication protocols may be used. In general, on-off keying modulation is a form of amplitude-shift keying modulation that represents digital data as the presence or absence of a carrier wave or oscillating signal having a carrier frequency $f_c$ (e.g., 300 MHz≤$f_c$≤1 GHz). The presence of the carrier for a specified duration represents a binary one, while its absence for the same duration represents a binary zero. This type of signaling is robust for isolation applications because a logic '0' state sends the same signal (e.g., nothing) as when the first domain loses power and the device gracefully assumes its default state. That behavior is advantageous in driver applications because it will not accidentally turn on the load device, even when the first domain loses power. However, isolator 104 may communicate other types of signals (e.g., pulse width modulated signals or other types of amplitude shift keying modulated signals) across isolation channel 120. The digital modulation scheme used may be determined according to performance specifications (e.g., signal resolution) and environment (e.g., probability of transient events) of the target application.

In at least one embodiment of isolator 104, integrated circuit die 106 receives a digital signal, e.g., asynchronously to an internal clock, and generates a modulated representation of the digital signal. Integrated circuit die 106 generates a carrier clock signal having a carrier frequency $f_c$ that is much greater than a frequency associated with data of the digital signal. By driving a differential pair of signals representing the data on a capacitively coupled conductor of isolation channel 120, integrated circuit die 106 provides integrated circuit die 108 with a representation of the data. Integrated circuit die 108 includes receiver circuitry that amplifies a received differential pair of signals and demodulates the received differential pair of signals to recover the data from the received differential pair of signals. A conventional integrated circuit die 108 includes a low-noise amplifier coupled in series with a signal conditioning circuit and a demodulator. The demodulator includes a rectifier circuit that generates a full-wave-rectified (FWR) signal and removes the carrier signal to provide a root mean square (RMS) proportional signal. Integrated circuit die 108 typically includes a comparator that resolves the RMS output of the rectifier circuit into a recovered digital signal.

Figure 3:
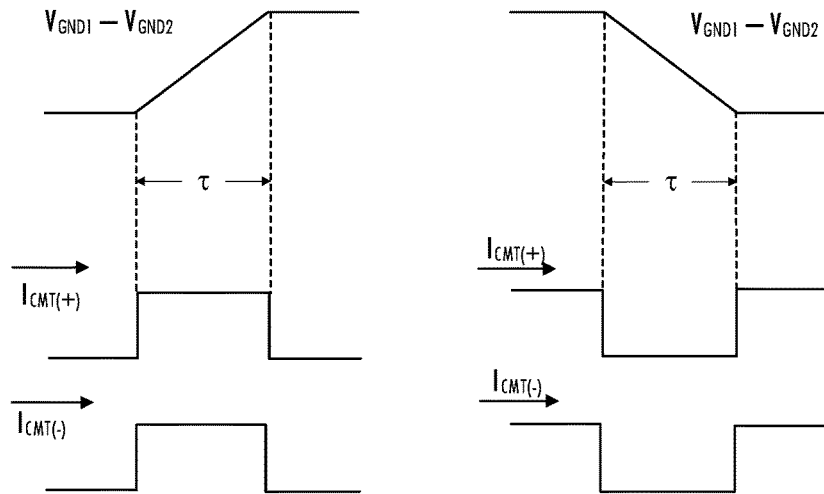
FIG. 3 illustrates exemplary waveforms for an exemplary capacitive isolation channel.
Figure 4:
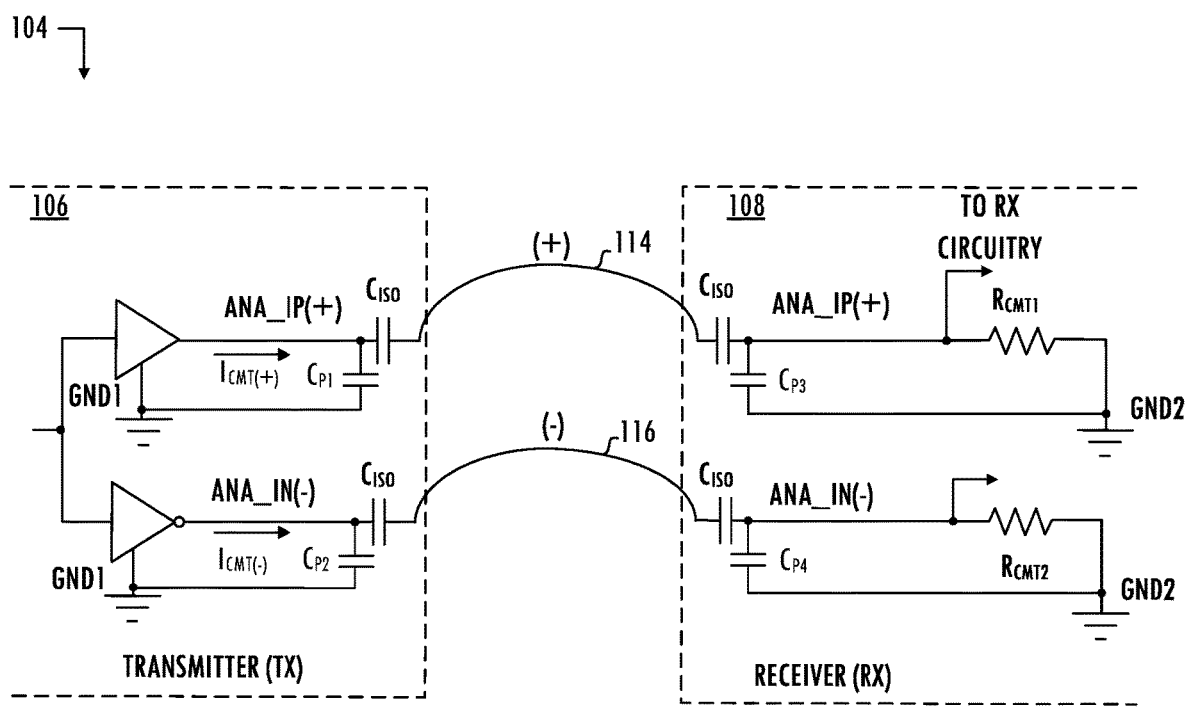
FIG. 4 illustrates a circuit diagram for an exemplary capacitive isolation channel.

Referring to FIGS. 3 and 4, isolator 104 transfers information between two exemplary ground domains that could be thousands of Volts apart. Further, the ground domains could be moving relative to each other at extremely fast voltage transients of approximately 100 KV/us. A conventional isolator product includes multiple differential channels, each including a differential pair of terminals. Each differential pair of terminals includes an inverting terminal ANA_IN and a non-inverting terminal ANA_IP on integrated circuit die 106 and are coupled by bond wires 114 and 116 to corresponding terminals of integrated circuit die 108.

Transients caused by relative differences between the ground of integrated circuit die 106 (GND1) relative to the second ground of integrated circuit die 108 (GND2) are referred to as common mode transient events. Ideally, circuit components are perfectly matched and a common mode transient event does not cause a differential event between differential pair of terminals ANA_IP (+) and ANA_IN (−). However, in practice, mismatch of actual circuit elements in the differential path and other factors cause a common mode transient current to generate a differential pulse at the input of integrated circuit die 108.

Mismatch of equivalent parasitic capacitance on the inverting terminal and equivalent parasitic capacitance on the non-inverting terminal of a differential pair of terminals may result from manufacturing process variations or physical design of integrated circuit die 106. In at least one embodiment, equivalent parasitic capacitance includes parasitic capacitance associated with bond wires referred to driver outputs. Differences in equivalent parasitic capacitance $C_{P1}$ of the inverting terminal ANA_IN and equivalent parasitic capacitance $C_{P2}$ of the noninverting terminal ANA_IP limit the common mode transient immunity of isolator 104 because a non-negligible parasitic capacitance mismatch causes a non-negligible voltage based on any common mode transient noise signal to be supplied concurrently to both the inverting terminal and the non-inverting terminal of a differential pair of terminals. Similarly, mismatch of equivalent parasitic capacitance $C_{P3}$ and equivalent parasitic capacitance $C_{P4}$ on the corresponding terminals of the differential pairs of terminals of integrated circuit die 108 limit the ability of isolator 104 to reject fast common mode transient noise signals. A common mode transient event may cause a substantial common mode transient current $I_{CMT}$ to flow through the isolation barrier capacitors $C_{ISO}$. Mismatch between positive common mode transient current $I_{CMT}(+)$ and negative common mode transient current $I_{CMT}(−)$ forms a differential pulse. As a result of this mismatch, mismatched voltage(s) develop across resistor $R_{CMT1}$ and resistor $R_{CMT2}$ and creates a voltage difference (i.e., a differential signal) between resistor $R_{CMT1}$ and resistor $R_{CMT2}$. That differential pulse can corrupt a digital signal recovered by receiver circuitry in integrated circuit die 108.

Figure 5:
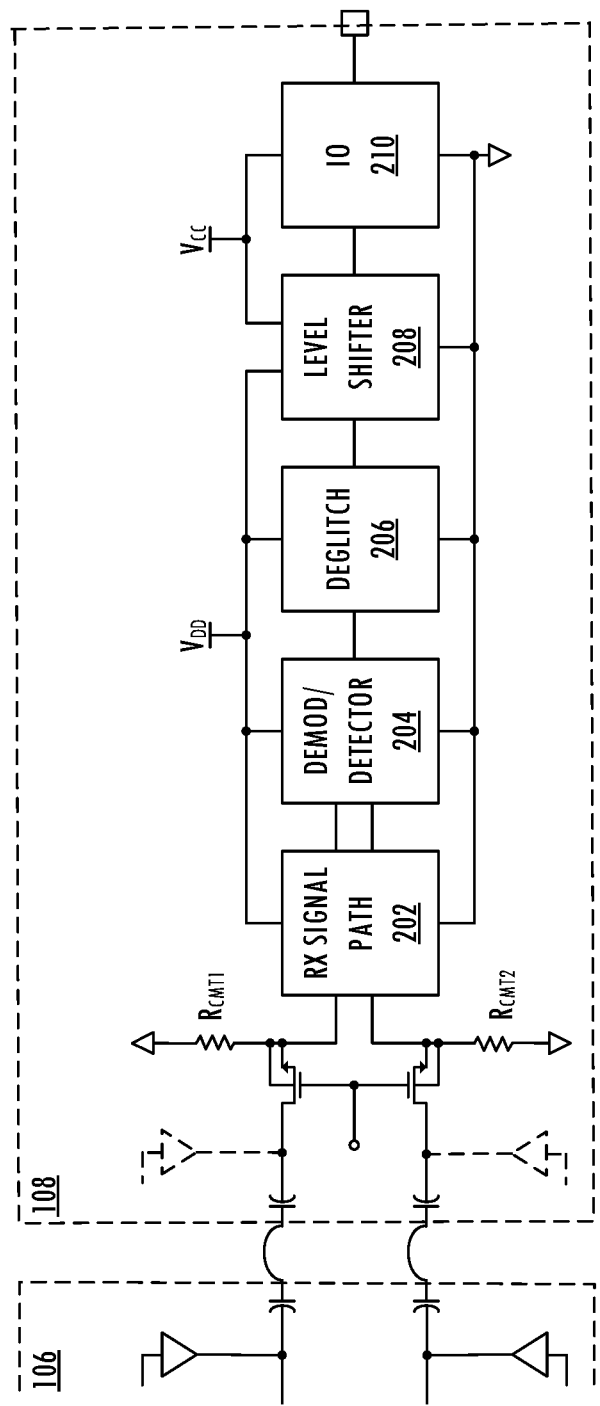
FIG. 5 illustrates a functional block diagram of an exemplary receiver signal path of an integrated circuit die in an exemplary isolator product.

FIG. 5 illustrates a functional block diagram of an exemplary receiver of integrated circuit die 108 of isolator 104 of FIG. 1. Receiver signal path 202 amplifies the signal received on a differential pair of terminals via isolation channel 120. Demodulator/detector 204 removes the carrier signal and recovers the digital data transmitted using the carrier signal. In at least one embodiment of integrated circuit die 108, the receiver signal path includes deglitcher 206, which filters out short duration glitches. In other embodiments of integrated circuit die 108 (e.g., in low-CMT applications), deglitcher 206 is omitted. Level shifter 208 converts the recovered digital signal from a low-voltage domain (e.g., power supply voltage $V_{DD}$ that is generated by a subregulator) to a high voltage, main power domain (e.g., main power supply $V_{CC}$ on the integrated circuit 108). Input/output 210 converts the recovered digital signal into a voltage format compatible with the load and drives the converted signal to a load that is external to integrate circuit 108.

Figure 6:
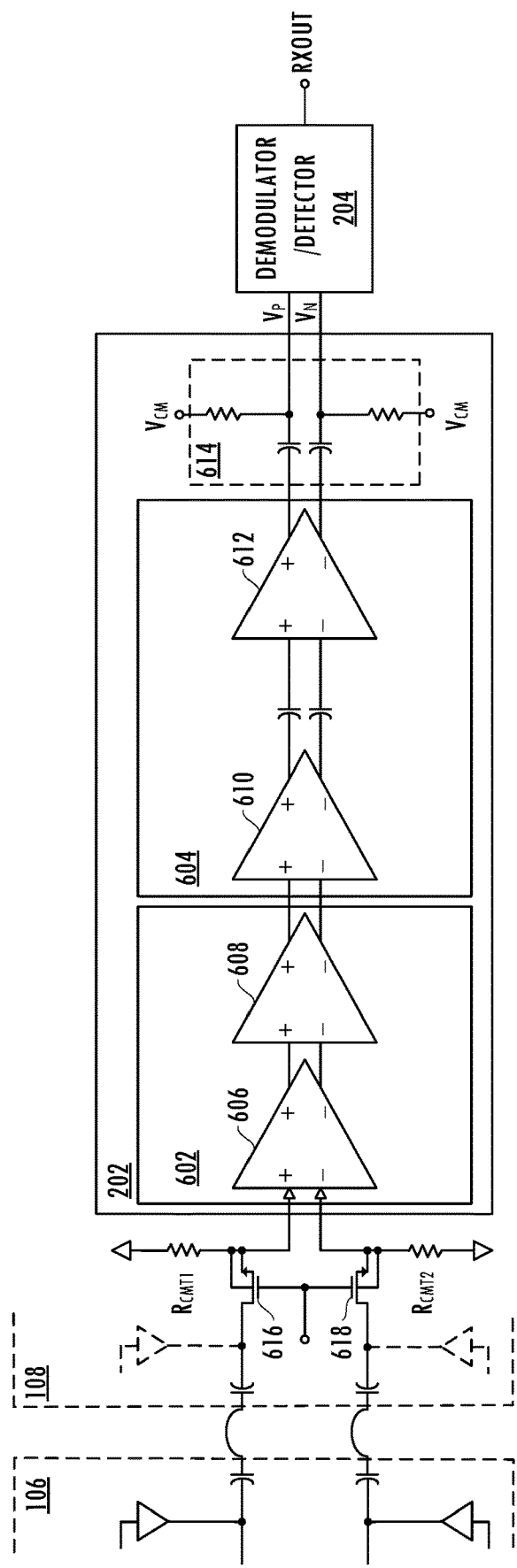
FIG. 6 illustrates a detailed circuit diagram of a portion of the exemplary receiver signal path of FIG. 5, consistent with at least one embodiment of the isolator product.

FIG. 6 illustrates a detailed circuit diagram of a portion of the exemplary receiver signal path of FIG. 5, consistent with at least one embodiment of the isolator product. Receiver signal path 202 includes fully differential circuits that support quiescent current programmability for target applications having varying power consumption. The receiver front end includes transistor 616, transistor 618, resistor $R_{CMT1}$, resistor $R_{CMT2}$, and front-end circuit 602. Front-end circuit 602 includes peaking gain stage 606, and peaking gain stage 608. In at least one embodiment, transistors 616 and 618 provide low impedances for input currents and are full-junction isolated transistors that tolerate the bulk terminal having a voltage below ground. The function of the receiver front end is to amplify the received differential pair of signals that develops between resistor $R_{CMT1}$ and resistor $R_{CMT2}$ while tolerating massive common mode transient signals.

Figure 7:
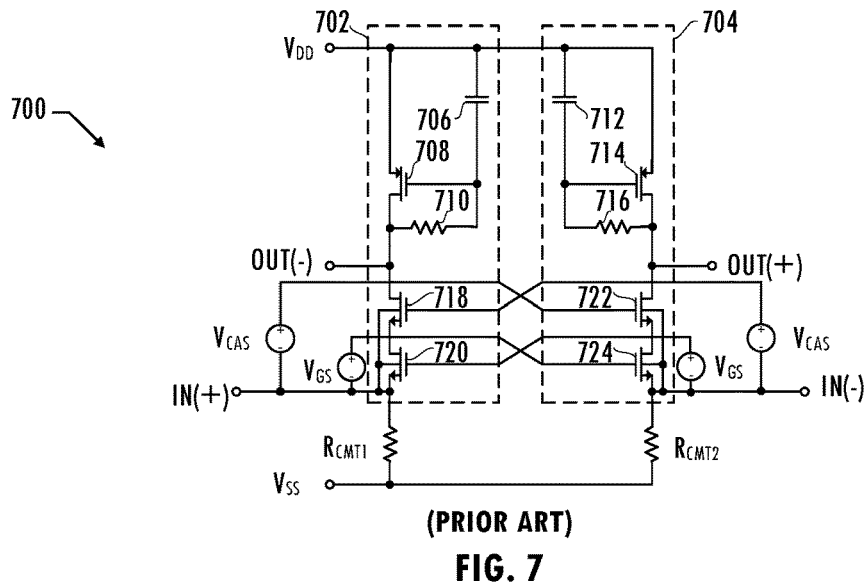
FIG. 7 illustrates a circuit diagram of a conventional first peaking gain stage of a conventional receiver front end.

FIG. 7 illustrates a circuit diagram of a conventional implementation of a first peaking gain stage. Peaking gain stage 700 is not fully differential and thus, does not include a virtual ground node. Instead, peaking gain stage 700 includes single-ended common gate amplifier 702 and single-ended common gate amplifier 704. Independent sources generate voltage $V_{CAS}$ and voltage $V_{GS}$. Cross-coupling of transistors 722 and 724 to transistors 718 and 720 improves gain since each signal of differential pair of signals IN(+) and IN(−) is added to voltage $V_{GS}$ and voltage $V_{CAS}$ and provided to the other circuit. Resistor 710, capacitor 706, and transistor 708, and resistor 716, capacitor 712, and transistor 714 of single-ended common gate amplifier 702 and single-ended common gate amplifier 704, respectively, form frequency-shaping active loads that cause peaking gain stage 700 to have a peak gain at a frequency at or near carrier frequency $f_c$. The frequency-shaping active loads improve common-mode transient immunity since the gain at carrier frequency $f_c$ is higher than the gain of frequencies that predominate common mode transient events. Although peaking gain stage 700 provides some common-mode rejection, mismatched devices in peaking gain stage 700 can cause common-mode-to-differential conversion of any common-mode transient signals, which degrades the output signals on output differential pair of nodes OUT(+) and OUT(−).

Figure 8:
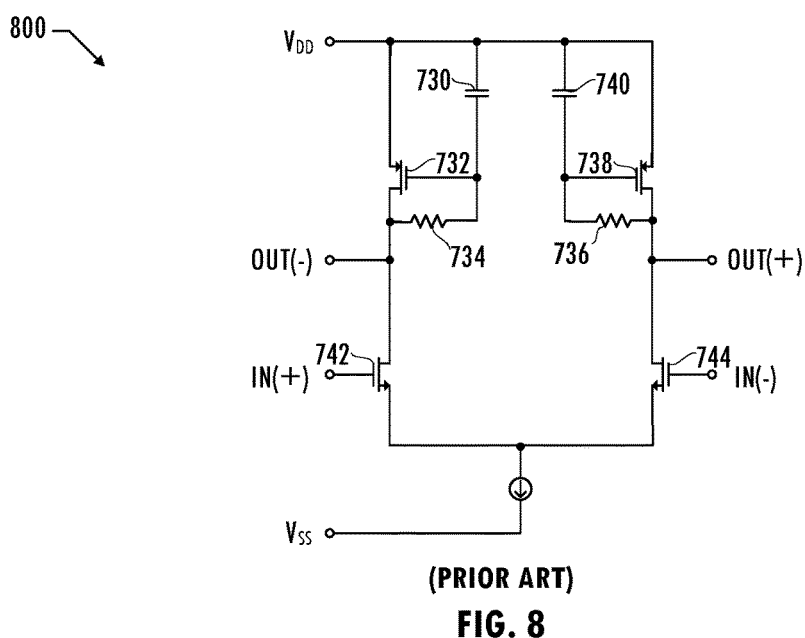
FIG. 8 illustrates a circuit diagram of a conventional second peaking gain stage of the exemplary receiver signal path of FIG. 6.

FIG. 8 illustrates a circuit diagram of a conventional implementation of a second peaking gain stage that is typically cascaded with a first peaking gain stage. Peaking gain stage 800 includes capacitor 730, transistor 732, resistor 734, capacitor 740, transistor 738, and resistor 736, that form a frequency-shaping active loads coupled to a differential pair of transistors that causes the conventional implementation of second peaking gain stage 608 to have a peak gain at a frequency at or near carrier frequency $f_c$. The frequency response of peaking gain stage 800 has an increased gain around a narrow frequency band before a cutoff frequency of the frequency response, creating a band-pass-like effect having the highest gain at or near carrier frequency $f_c$. In contrast, a simple diode-connected active load would cause the frequency response to be flat up until the cutoff frequency. The frequency-shaping active loads improve common-mode transient immunity since the gain at the carrier frequency is higher than the gain of frequencies that predominate common mode transient events. Transistors 742 and 744 form a differential pair of transistors that convert voltage into current driving the frequency-shaping active loads. The simple topology of the peaking gain stage 800 creates a frequency-dependent loading effect on any prior gain stages. That is, cascaded peaking gain stages result in a cascaded peaking frequency that is not the same as (e.g., has a lower frequency than) the design-targeted peaking frequency of each individual stage. That frequency-dependent loading effect complicates the design of quiescent-current-programmable signal paths (e.g., for low power modes of operation) having individual gain stages with programmable tail current sources and can degrade the recovered data.

Figure 9:
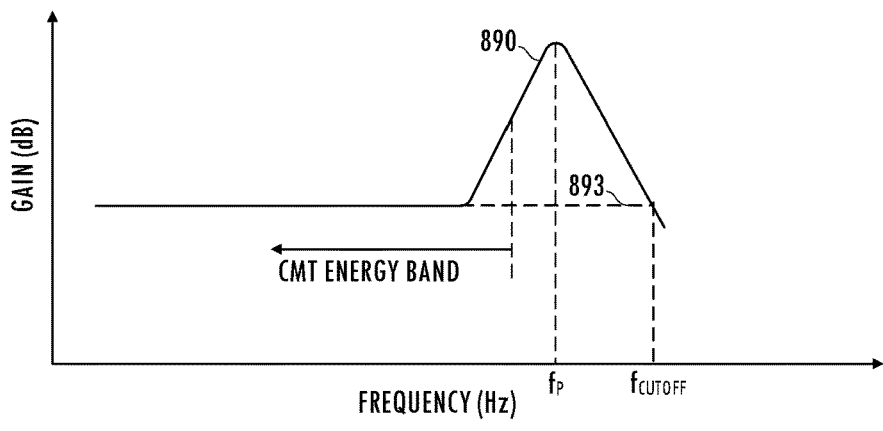
FIG. 9 illustrates a transfer function of an individual peaking gain stage.

FIG. 9 illustrates an exemplary frequency response of the conventional peaking gain stages described above. Frequency response 890 is flat until peaking at or near carrier frequency $f_c$, which is just prior to a cutoff frequency (e.g., the cutoff frequency is two to three times the carrier frequency). The peaking is the result of the frequency-shaping active loads. By amplifying signals at or near the carrier frequency $f_c$ more than in other frequencies of the pass band, a peaking gain stage has a band-pass effect on those signals occurring where the gain is highest. If a simple diode-connected active load were used instead, the frequency response would be flat for the entire pass band, as indicated by frequency response 893. Thus, signals at carrier frequency $f_c$ are amplified more than common-mode transient signals.

Figure 10:
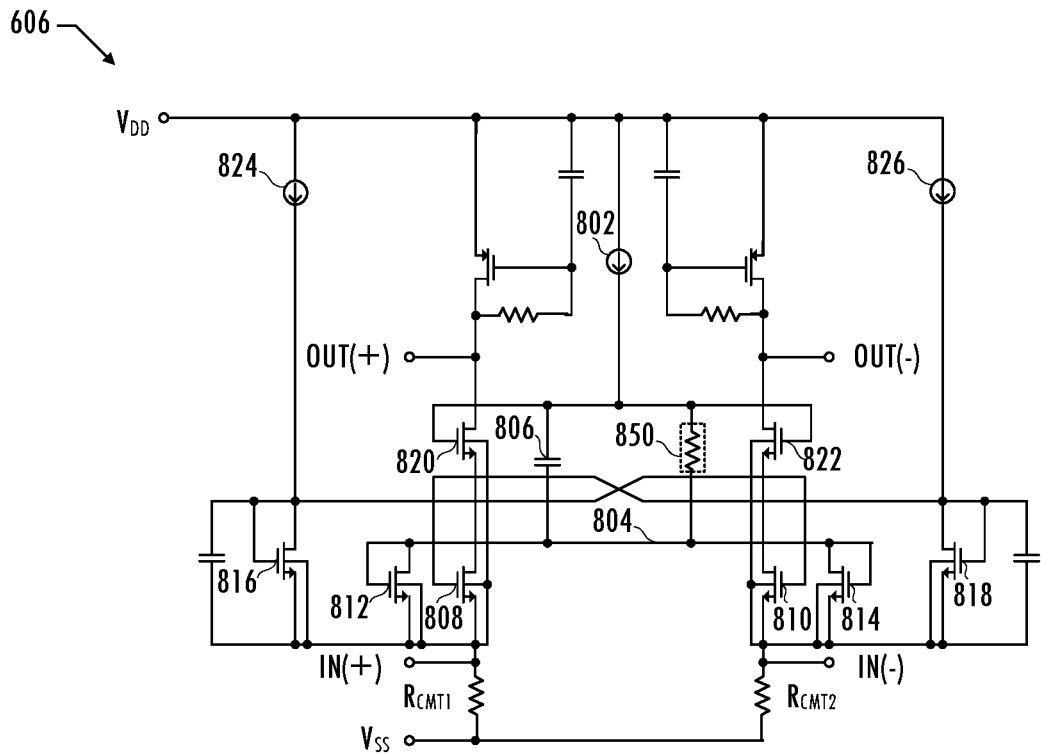
FIG. 10 illustrates a circuit diagram of a first peaking gain stage of the receiver signal path of FIG. 6 consistent with at least one embodiment of the isolator product.

A front-end circuit including a first peaking gain stage and a second peaking gain stage that have programmable quiescent currents, common-mode transient immunity, and a cascaded peaking frequency that is the same as (or negligibly different from) the individual peaking frequency are disclosed. FIG. 10 illustrates a circuit diagram of a first peaking gain stage of the receiver front end having a low input impedance. Transistors 808, 812, 816, and transistors 810, 814, and 818 form two halves of a symmetrical common-gate differential circuit. Half of current 802 flows into transistor 812 and half of current 802 flows into transistor 814. The common-gate node of transistors 812 and 814 is configured as a virtual ground. Each signal of the differential pair of signals is coupled across to the gate of the opposite transistor of the differential pair of transistors, which increases or maximizes the gain of each signal of the differential pair of signals. Input node IN(+) is coupled across to the gate of transistor 810 and input IN(−) is coupled across to the gate of transistor 808. The current densities of transistors 808 and 816 (i.e., current per W/L, where W is the width of the transistor gate and L is the length of the transistor channel) are set to be equal, and thus are equalized to the current densities of transistors 810 and 818 (e.g., the overall current ratio of transistors 808 and 816 is k:1, where k is an integer, e.g., 4:1 and where the current densities are equalized as described above), respectively. Each half of the differential circuit of first peaking gain stage 606 is fully isolated and can withstand massive common mode transients on the differential pair of input nodes IN(+) and IN(−) (e.g., ±0.5V) without activating any parasitic junctions.

Cascode transistors 820 and 822 are biased relative to virtual ground 804. Virtual ground 804 is representative of the common mode signal in the differential pair of input signals. For example, the voltage on virtual ground 804, $V_{804}=V_{CM}+V_{GS812|GS814}$, where $V_{GS812|GS814}$ indicates the gate-to-source voltage of transistor 812 or the gate-to-source voltage of transistor 814. Resistance 850 and capacitor 806 are configured as a floating voltage source for establishing a cascode gate bias relative to virtual ground 804. Thus, the cascode gate bias voltage increases or decreases according to common mode signal changes (e.g., common mode transient signals). No substantial differential signal is coupled to the gates of cascode transistors 820 and 822, unlike in the conventional peaking gain stage described above. The voltage drop across resistance 850 sets the drain-to-source voltages of transistors 808 and 810 that are configured as a common-gate differential pair of transistors.

Figure 12:
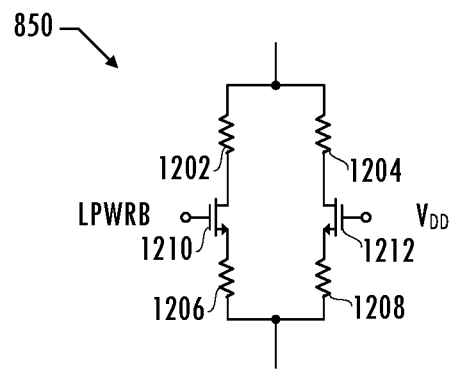
FIG. 12 illustrates a circuit diagram of a selectively configurable resistance used in a peaking gain stage of FIG. 9 or FIG. 10 consistent with at least one embodiment of the isolator product.

The differential topology of first peaking gain stage 606 supports selective configuration of power consumption (e.g., by selectively reducing by 50% each of currents 802, 824, and 826). In at least one embodiment, resistance 850 is selectable to maintain approximately the same voltage across resistor 850 and capacitor 806 as currents 802, 824, and 826 change according to a selected power consumption configuration. Resistance 850 maintains an approximately fixed voltage drop across the gate terminals of cascode transistors 820 and 822 and virtual ground 804. Referring to FIG. 10, in at least one embodiment, to maintain the voltage drop across resistance 850 in a reduced power consumption configuration, resistance 850 is implemented using a parallel combination of resistances of 2×R to provide an effective resistance of R. Each branch of that parallel combination includes two resistors of resistance R coupled in series, as illustrated in FIG. 12. For example, resistors 1202 and 1206 each have a resistance R and are coupled in parallel with resistors 1204 and 1208, each having a resistance R. During a low power mode, control signal LPWRB disables transistor 1210 while transistor 1212 is enabled by power supply voltage $V_{DD}$. The equivalent resistance becomes 2×R instead of R and the voltage drop across resistance 850 does not change in response to halving the current flowing through resistance 850. The configuration of FIG. 12 is exemplary only and other configurations and resistor ratios may be used, e.g., to implement other power consumption reduction ratios. In at least one embodiment, peaking gain stage 606 directly drives (i.e., without buffering) peaking gain stage 608.

Figure 10A:
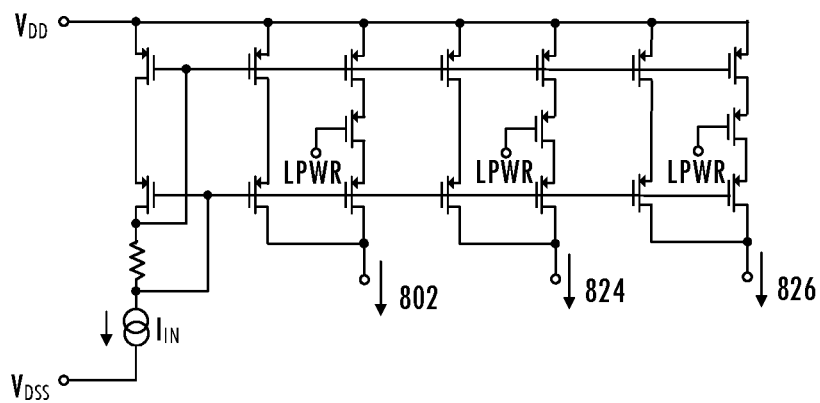
FIG. 10A illustrates a circuit diagram of an exemplary segmented current mirror of the first peaking gain stage of FIG. 10 consistent with at least one embodiment of the isolator product.

FIG. 10A illustrates an exemplary segmented current mirror that selectively generates currents 802, 824, and 826 according to power consumption control signal LPWR, which selectively reduces current by 50%. Some mirror segments include a series switch that selectively controls the output current to implement a target current mirror ratio (e.g., an integer multiple of an input least-significant bit bias current). Currents 802, 824, and 826 are implemented using two segments that can selectively reduce the corresponding current by 50%, although additional segments or different current mirror ratios may be used.

Figure 11:
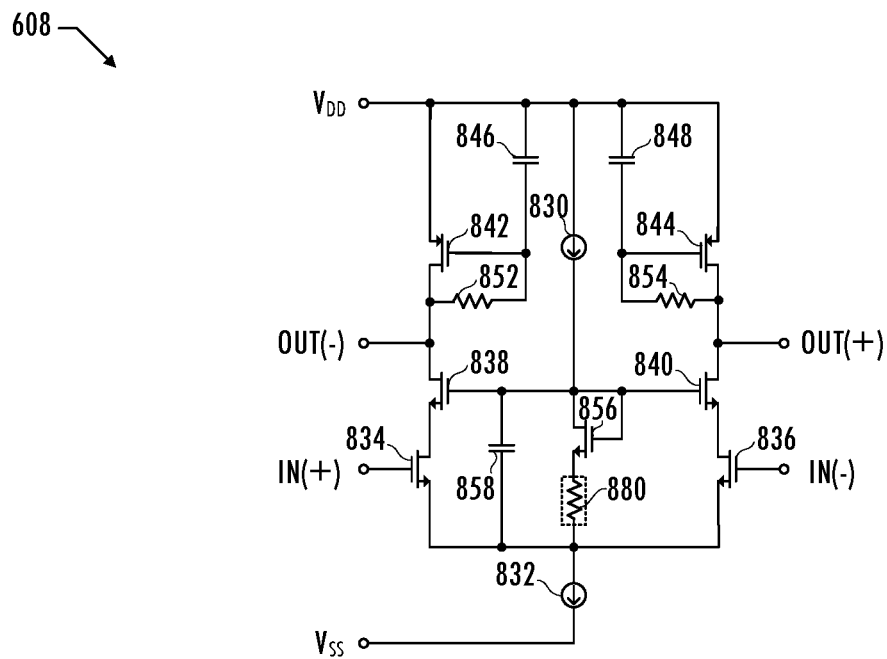
FIG. 11 illustrates a circuit diagram of a second peaking gain stage of the receiver signal path of FIG. 6 consistent with at least one embodiment of the isolator product.

FIG. 11 illustrates a circuit diagram of second peaking gain stage 608 of the front-end circuit consistent with at least one embodiment of the isolator product. Current 830 is a portion of current 832 that passes through resistance 880 and self-biased diode-connected transistor 856 and configures transistors 838 and 840 as a telescopic pair of cascode transistors. In at least one embodiment, current 830 is selectively configurable according to a power consumption control signal and resistance 880 has the selectively configurable implementation illustrated in FIG. 12 to realize a fixed voltage drop across the selected power consumption configurations. However, in other embodiments, current 830 and resistance 880 are fixed. Referring to FIG. 11, current 832 is provided by a selectively configurable tail current that supports quiescent current programmability. The selectively configurable tail current source provides (N+1)×I current, where I is a unit current and current 830 is the unit current. In at least one embodiment, current 832 is generated using a complementary version of the segmented current source of FIG. 10A (e.g., a version of the segmented current source of FIG. 10A using n-type transistors and configured to provide a selectively configurable tail current). Accordingly, current of N×I partitions into two currents that flow through transistor 834 and 836, respectively. Transistors 834 and 836 and transistors 838 and 840 are configured as a telescopic differential circuit. Resistance 880 creates a bias voltage drop and sets a minimum guaranteed value of the drain-to-source voltage for transistors 834 and 836, which are configured as a differential pair of transistors. Transistors 842 and 844, capacitors 846 and 848, and resistors 852 and 854 create frequency-shaping active loads. Transistors 838 and 840 are configured as cascode transistors that reduce or eliminate any frequency-dependent loading effects created by this circuit from affecting peaking gain stage 606, which is coupled to the gate nodes of transistors 834 and 836. Capacitor 858 maintains a suitable self-biased operating point for the cascode transistors during common mode transient events.

Figure 13:
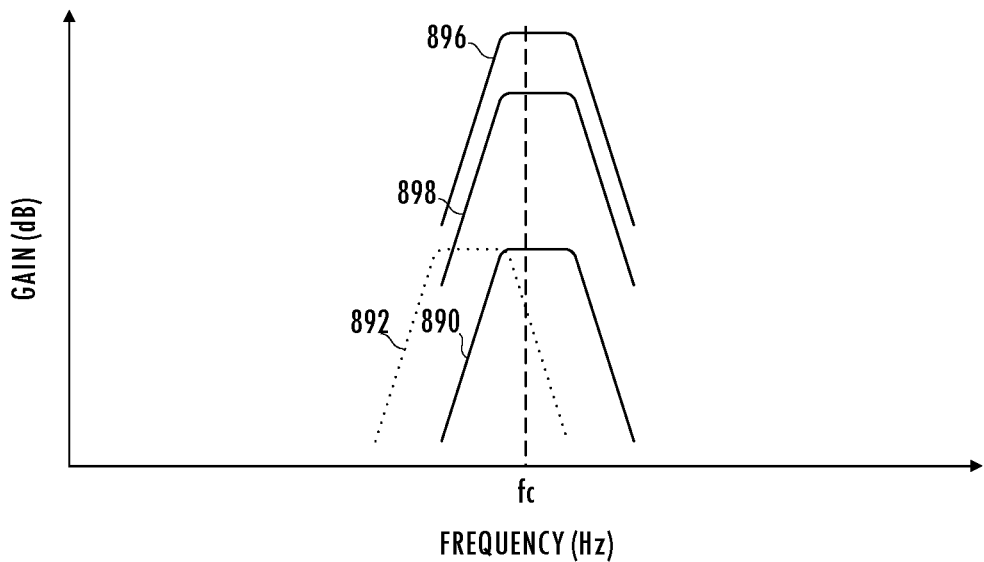
FIG. 13 illustrates portions of transfer functions of individual bandpass gain stages and cascaded bandpass gain stages.

Peaking gain stages 606 and 608 described above support low-power operation with negligible or no frequency-dependent loading of peaking gain stage 608 on peaking gain stage 606. Therefore, peaking gain stage 606 and peaking gain stage 608 can be designed independently with a peak gain at or near the carrier frequency $f_c$ and cascaded to have a cascaded peak gain occurring at or near carrier frequency $f_c$. Referring to FIG. 13, cascading of peaking gain stages 606 and 608 preserves the location of the pass band in the frequency response of front-end circuit 602. For example, frequency response 890 and frequency response 898, are detailed portions of the frequency responses for a first peaking gain stage and a second peaking gain stage, respectively. The frequency responses of the peak portions provide a band pass filter effect, amplifying at the frequency range around carrier frequency $f_c$. Frequency response 890 and frequency response 898 each have a maximum gain at carrier frequency $f_c$. In some applications, when cascading peaking gain stages, alignment of the flattest regions of the peak frequency responses is critical since these are the regions of the smallest rate of change of the gain. Cascading regions where gain is not a strong function of frequency results in increased gain variation with slight changes in the carrier frequency $f_c$, which may occur due to manufacturing variations. Eliminating loading effects of the peaking gain stages allows cascading stages in their least gain-variable regions preserving the pass band location, as illustrated with frequency response 896 for the cascaded peaking gain stages. In contrast, the cascading of a conventional first peaking gain stage with a conventional second peaking gain stage shifts frequency response 890 of the first peaking gain stage to frequency response 892.

Figure 14:
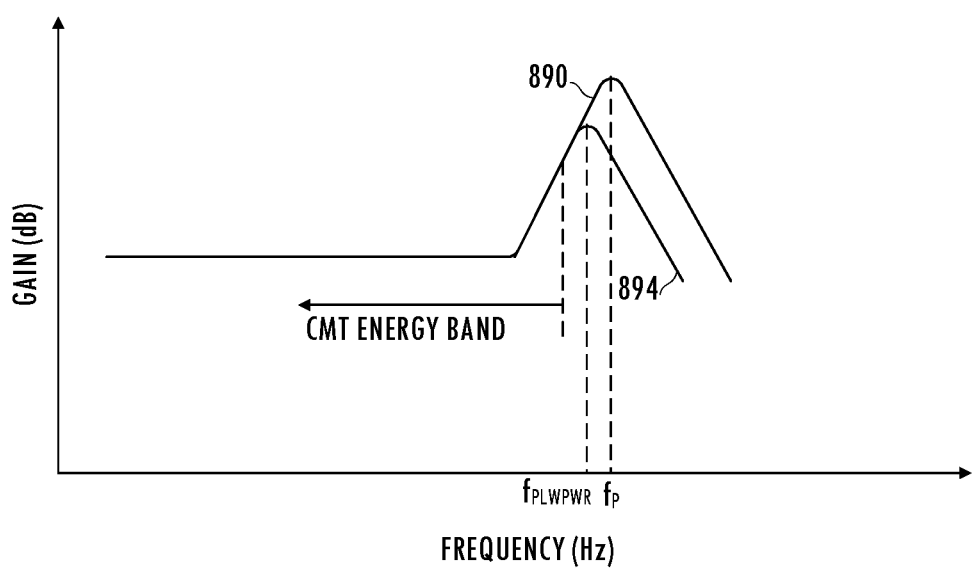
FIG. 14 illustrates a transfer function of a peaking gain stage in full power mode and a transfer function of the peaking gain stage in a low power mode.

Referring to FIGS. 6 and 14, selectively configuring first peaking gain stage 606 and second peaking gain stage 608 to operate in low-power mode reduces power consumption of front-end circuit 602. The low power configuration causes a shift of the frequency response of front-end circuit 602 from frequency response 890 to low-power frequency response 894. Accordingly, the frequency corresponding to a peak gain of the frequency response of front-end circuit 602 shifts to a lower frequency in the low-power mode of operation (e.g., from frequency $f_P$ to frequency $f_{PLWPWR}$). Thus, to obtain performance similar to the performance in a full-power configuration, the low-power configuration requires operating the system at a lower carrier frequency $f_c$. In addition, the low-power configuration increases the effects of any common mode transient events since the low-power configuration reduces the signal gain at the carrier frequency $f_c$ relative to the gains of common mode transients that fall within the common mode transient energy band. In some applications, the ability to operate in a low-power configuration is critical and must be supported, thus, creating a need for lower power isolator products and receiver signal paths.

Referring to FIG. 6, in at least one embodiment of receiver signal path 202, variable peaking gain stage 604 compensates for loss of gain by front-end circuit 602 in low-power configurations. Variable peaking gain stage 604 includes programmable flat gain stage 610 and peaking gain stage 612 and is coupled to high pass filter 614. Variable peaking gain stage 604 further amplifies the received signal and provides a robust mechanism for adjusting the gain of receiver signal path 202 to address gain variations (e.g., variations due to programmable power consumption or variations due to bond wires or isolation capacitors).

As discussed above, reducing the power consumption of peaking gain stages 606 and 608 (e.g., by selectively reducing the current provided by tail current sources in the peaking gain stages) shifts to a lower frequency the peak at which maximum gain occurs. That frequency shift requires operating the system at a lower carrier frequency $f_c$ to obtain the same performance as in a full power configuration of front-end circuit 602. A modest gain reduction in one gain stage can have a substantial effect on receiver signal path 202 including cascaded gain stages. For example, if three gain stages are cascaded and each gain stage has a gain of five at carrier frequency $f_c$, the cascaded gain is 5×5×5=125. However, if a low-power configuration reduces the gain of each stage by 25% at carrier frequency $f_c$, each gain stage has a gain of 3.75 and a cascaded gain of 3.75×3.75×

3.75=52.7, which is substantially less than the cascaded gain of the full-power configuration. To support selectable power consumption (e.g., using quiescent current programmability), variable peaking gain stage 604 at least partially compensates for the loss of gain associated with reduced power consumption configurations of front-end circuit 602. That gain compensation contributes to receiver signal path 202 providing demodulator/detector 204 with a signal having a suitable level for reliably detecting the information received via the isolation channel.

Figure 15:
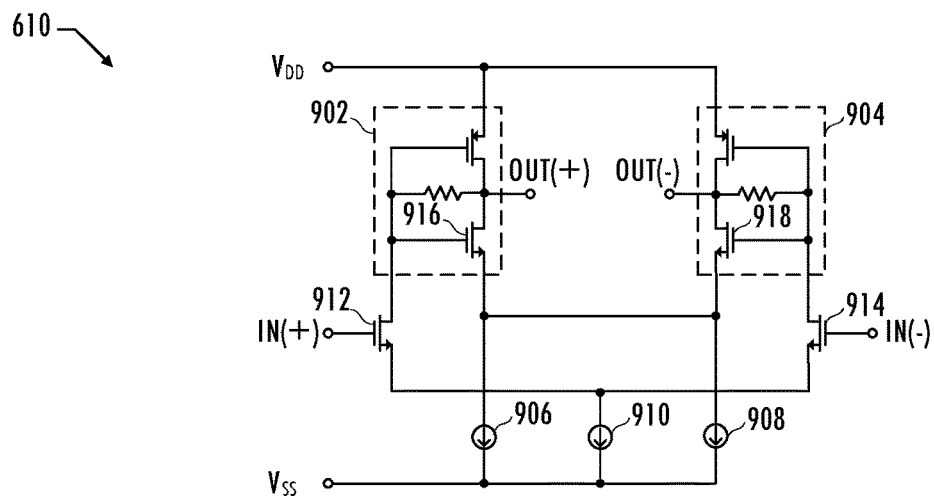
FIG. 15 illustrates a circuit diagram of a programmable gain stage of the receiver signal path of FIG. 6 consistent with at least one embodiment of the isolator product.

In at least one embodiment, peaking gain stage 608 directly drives (i.e., without buffering) variable peaking gain stage 604. Variable peaking gain stage 604 has a programmable variable gain. Variable peaking gain stage 604 includes programmable flat gain stage 610 with a frequency response having a flat pass band (i.e., a gain that has negligible variation with respect to frequency) that drives peaking gain stage 612. FIG. 15 illustrates a circuit diagram of programmable flat gain stage 610 consistent with at least one embodiment of the isolator product. Programmable flat gain stage 610 includes an inverter-like active load 902 and 904 that is capable of directly driving a downstream peaking gain stage. Selectable values of currents 906, 908, and 910 provide programmability of the flat gain value, which allows for one or more low-power configurations of front-end circuit 602 or adjustment to compensate for changes to bond wire length or other customization of the communications channel. The selectable values may be selected (i.e., predetermined) using one-time programmable memory or other programming techniques. In at least one embodiment, the predetermined gain of flat gain stage 610 is inversely related to the predetermined power consumption configuration. Programmable flat gain stage 610 includes transistors 912 and 914 configured as an outer differential pair of transistors and transistors 916 and 918 configured as an inner differential pair of transistors. The outer differential pair of transistors is coupled to a tail current source that provides an integer multiple of a unit current (i.e., $I_{910}=n \times I_{LSB}$) and the inner differential pair of transistors is coupled to another tail current source that provides (or corresponding tail current sources that jointly provide) a larger integer multiple of the unit current (e.g., $1906+1908=((n+2) \times I_{LSB})$). Programmable peaking gain stage 610 provides a differential output signal that is received by peaking gain stage 612. In at least one embodiment, programmable flat gain stage 610 directly drives (i.e., without buffering) peaking gain stage 612 to form a programmable peaking gain stage.

Figure 16:
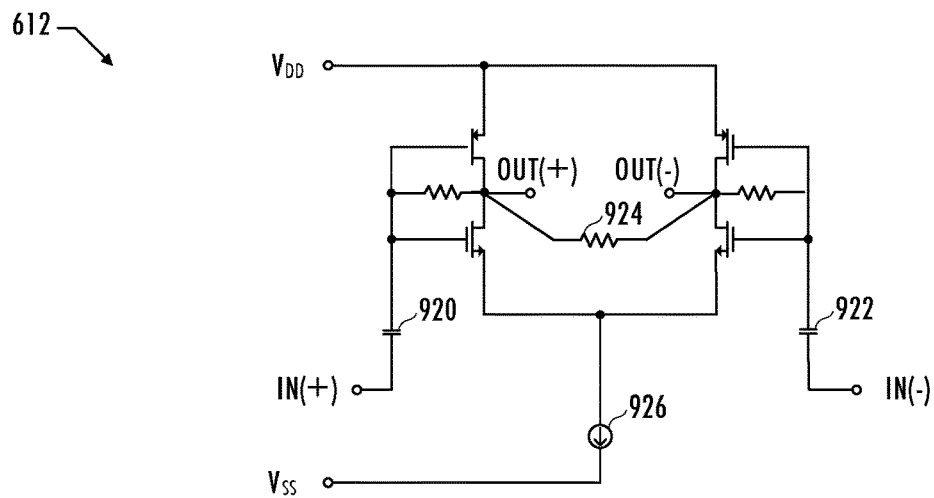
FIG. 16 illustrates a circuit diagram of a capacitively-coupled peaking gain stage of the receiver signal path of FIG. 6 consistent with at least one embodiment of the isolator product.

Referring to FIGS. 6 and 16, unlike peaking gain stages 606 and 608 described above, peaking gain stage 612 is an AC-coupled, common-source amplifier. Capacitors 920 and 922 block DC offsets from all prior stages of receiver signal path 202 and the isolation channel. Resistor 924 reduces DC gain and linearizes the gain stage response, but also reduces the overall gain. Therefore, in at least one embodiment of peaking gain stage 612, resistor 924 is omitted. Peaking gain stage 612 has a frequency response similar to peaking gain stages 606 and 608, providing a band-pass filter-like response centered at or near carrier frequency $f_c$. Peaking gain stage 612 generates a quiescent current that is programmable via current source 926, which is coupled to a tail node of the common-source amplifier. Peaking gain stage 612 in combination with programmable flat gain stage 610 has gain with dynamic range that is sufficient to offset the loss of gain of peaking gains stages 608 and 610 when configured for low-power operation. Peaking gain stage 612 directly (i.e., without buffering) drives high-pass filter 614, which removes output-referred offsets created by peaking gain stage 612. High-pass filter 614 uses a local common mode voltage generator to center differential pair of signals $V_P$ and $V_N$ around a common mode voltage suitable for demodulator/detector 204.

Figure 17:
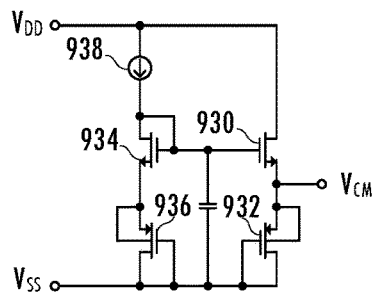
FIG. 17 illustrates a circuit diagram of a common mode voltage generator for use with the receiver signal path of FIG. 6 consistent with at least one embodiment of the isolator product.

Referring to FIGS. 6 and 17, an exemplary common mode voltage generator includes transistors 930 and 932, which are configured as a push-pull output stage that has a low AC impedance (e.g., $1/(g_{m930}+g_{m932})$) and can source and sink current through node $V_{CM}$ as needed by high-pass filter 614. In at least one embodiment, the common mode voltage generator sources or sinks current that is linearly related to the amplitude of the received differential pair of signals $V_P$ and $V_N$ thereby maintaining a stable common mode voltage level. In addition, transistors 930 and 932 can source and sink DC currents, which may be needed by demodulator/detector 204. Current source 938 and transistors 934 and 936 form a replica-biasing circuit that drives the push-pull output stage to form a low impedance voltage source. The replica-biasing branch, which includes current source 938, transistor 934, and transistor 936, sets common mode voltage $V_{CM}$ to approximately the magnitude of the gate-to-source voltage of transistor 932, which is approximately equal to the magnitude of the gate-to-source voltage of transistor 936 (i.e., the magnitude of a threshold voltage of a p-type transistor). In at least one embodiment, the common mode voltage is in the range of 400 mV to 550 mV and provides sufficient voltage headroom for a fully differential signal centered about common mode voltage $V_{CM}$ to swing towards ground at the input of demodulator/detector 204. For example, the fully differential signal has a magnitude of $|V_{tp}| \pm V_{diffsignal}$.

Referring to FIG. 6, in a full-power configuration, peaking gain stage 608 generates a differential pair of signals having sufficient gain at the peaking frequency (i.e., carrier frequency $f_c$). Therefore, variable peaking gain stage 604 is configured with low gain settings. In a low-power configuration of front-end circuit 602, peaking gain stage 608 generates a differential pair of signals $V_P$ and $V_N$ having insufficient gain at peaking frequency $f_{cLWPWR}$. To compensate for the loss of gain when peaking gain stages 606 and 608 are configured for low-power operation, variable peaking gain stage 604 is configured with a high gain setting. As a result, differential pair of signals at the output of high pass filter 614 have sufficient strength for demodulator/detector 204 to reliably resolve them into a digital signal that corresponds to information transmitted via the isolation channel. In at least one embodiment, the selectable gain of variable peaking gain stage 604 is configured to compensate for manufacturing variations (e.g., slightly increased or decreased isolation capacitor values). In at least one embodiment, suitable gain values are predetermined using automatic test equipment during production test, which allows release of an entire product line using instantiations of the same integrated circuit device with different configurations of power and gain settings according to target applications.

Figure 18:
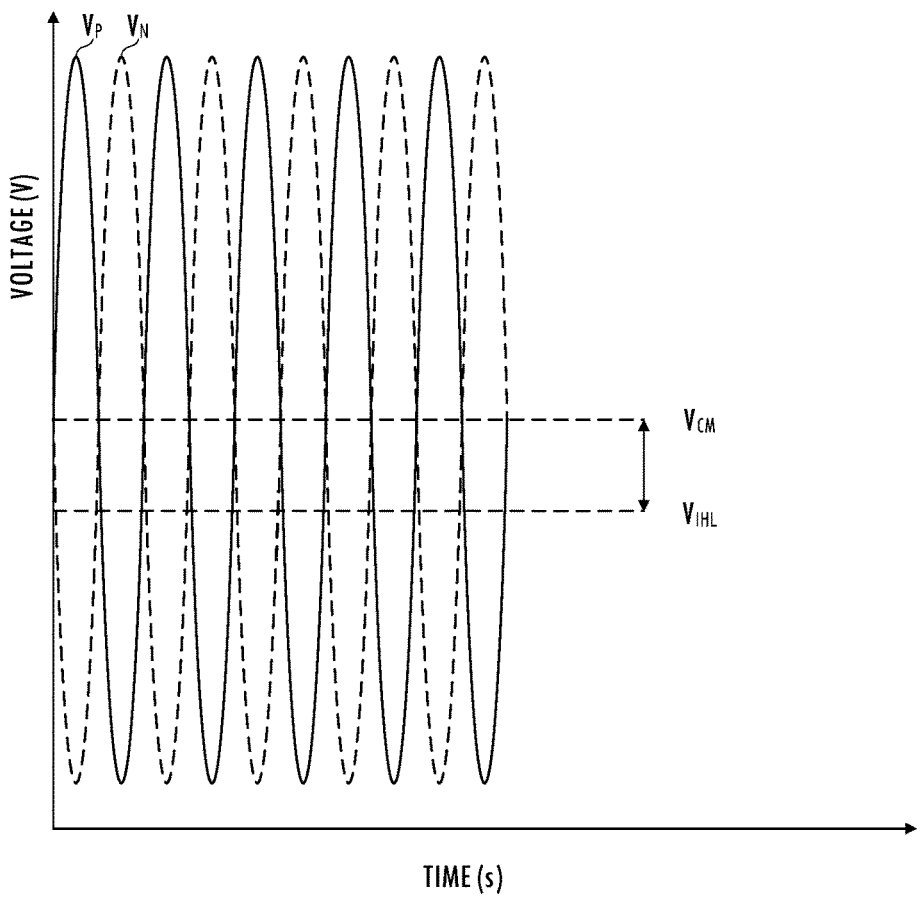
FIG. 18 illustrates waveforms for an exemplary differential pair of signals at the output of a high pass filter of the receiver signal path of FIG. 6 consistent with at least one embodiment of the isolator product.

Demodulator/detector 204 removes the carrier from received differential pair of signals $V_P$ and $V_N$. In addition, demodulator/detector 204 compares the demodulated signal to a reference signal and generates a logic '0' signal or a logic '1' signal based on the comparison. Ideally, demodulator/detector 204 generates the logic signal based on received differential pair of signals $V_P$ and $V_N$ with as little propagation delay as possible and with a delay that is as symmetrical as possible (i.e., with little or no duty cycle distortion). FIG. 18 illustrates exemplary waveforms for received differential pair of signals $V_P$ and $V_N$. Each signal of received differential pair of signals $V_P$ and $V_N$ is centered around common mode voltage $V_{CM}$. Common mode voltage $V_{CM}$ has a voltage level that is sufficient to support signal swing toward ground such that $V_{CM}-V_{PEAK}$ is greater than 0 V, where $V_{PEAK}$ is the peak voltage of received differential pair of signals $V_P$ and $V_N$. Each signal of received differential pair of signals $V_P$ and $V_N$ has a signal swing of $V_{CM}-V_{PEAK}$ to $V_{CM}+V_{PEAK}$ and a peak-to-peak voltage of $2\times V_{PEAK}$. Differential signal $V_P-V_N$ has a swing of $\pm 2\times V_{PEAK}$. As described above, in at least one embodiment, the common mode voltage is in the range of 400 mV to 550 mV, which provides sufficient voltage headroom for the differential pair of signals to swing towards ground at the input of demodulator/detector 204. In some embodiments, receiver signal path 202 does not gain the signal up to that level since levels above 200 mV are sufficient to be reliably demodulated and resolved by demodulator/detector 204.

Figure 19:
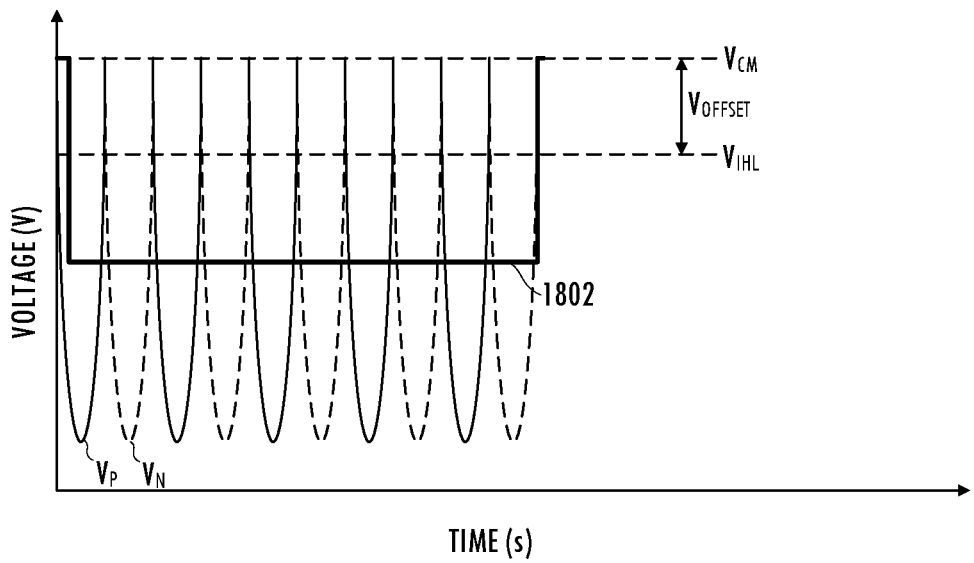
FIG. 19 illustrates waveforms for a mechanism of demodulating an exemplary differential pair of signals at the output of a high pass filter of the receiver signal path of FIG. 6 consistent with at least one embodiment of the isolator product.

In an exemplary embodiment, demodulator/detector 204 demodulates an on-off keying modulated signal. Referring to FIGS. 6 and 18, in at least one embodiment, demodulator/detector 204 detects the lesser signal of the differential pair of signals $V_P$ and $V_N$. In the exemplary waveforms, the first lobe of signal $V_N$ is lower than the first lobe of signal $V_P$, the second lobe of signal $V_P$ is lower than the second lobe of signal $V_N$, etc. In at least one embodiment, demodulator/detector 204 includes a minimum selector that identifies which signal has the lower of the two lobes. Referring to FIGS. 6 and 19, the output of the minimum selector is an equivalent average value of the identified lower lobe, illustrated by equivalent average signal 1802. That equivalent average value is much lower than common mode voltage $V_{CM}$ (e.g., $2\times V_{OFFSET}$, where $V_{OFFSET}=V_{CM}-V_{IHL}$, or other voltage below predetermined threshold voltage $V_{IHL}$). Demodulator/detector 204 compares that equivalent average signal to predetermined threshold voltage $V_{IHL}$, which is approximately half the average voltage of a lower lobe of signal $V_P$ or signal $V_N$.

Figure 20:
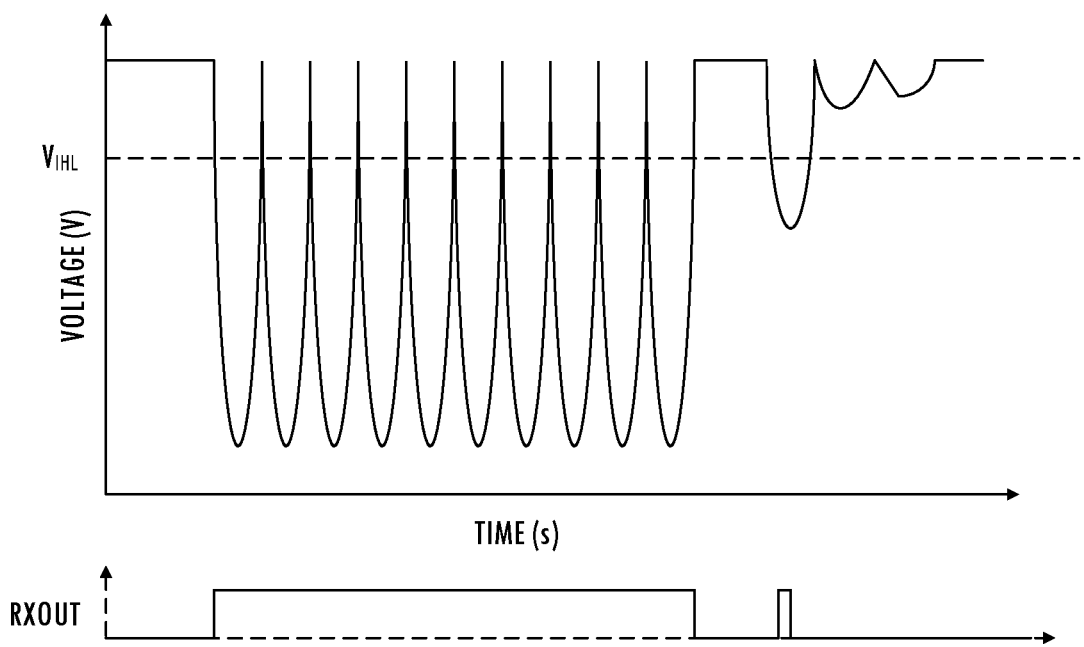
FIG. 20 illustrates waveforms for an exemplary detector circuit consistent with at least one embodiment of the isolator product.

Referring to FIGS. 6 and 20, demodulator/detector 204 functions as a 1-bit discriminator that generates a 1-bit output signal based on comparing the signal to predetermined threshold voltage $V_{IHL}$. If the equivalent average signal is less than predetermined threshold voltage $V_{IHL}$, then demodulator/detector 204 causes output signal RXOUT to have a logic '1' signal level. If the equivalent average signal is greater than predetermined threshold voltage $V_{IHL}$, then demodulator/detector 204 causes output signal RXOUT to have a logic '0' signal level. Although a target predetermined threshold voltage $V_{IHL}$ is half of the equivalent average value of a lobe, other values of predetermined threshold voltage $V_{IHL}$ provide suitable recovery of the digital data from the received pair of differential signals. Predetermined threshold voltage $V_{IHL}$ is defined as $V_{CM}-V_{OFFSET}$, where $V_{OFFSET}$ is the DC voltage level difference between predetermined threshold voltage $V_{IHL}$ and common mode voltage $V_{CM}$. A programmable predetermined threshold voltage $V_{IHL}$ accommodates variations of peak voltage level $V_{PEAK}$ from part-to-part. In some embodiments, a deglitcher coupled to demodulator/detector 204 removes narrow pulses generated by demodulator/detector 204 in response to common-mode transient in-band interference that results in an equivalent average signal that is less than predetermined threshold voltage $V_{IHL}$.

Figure 21:
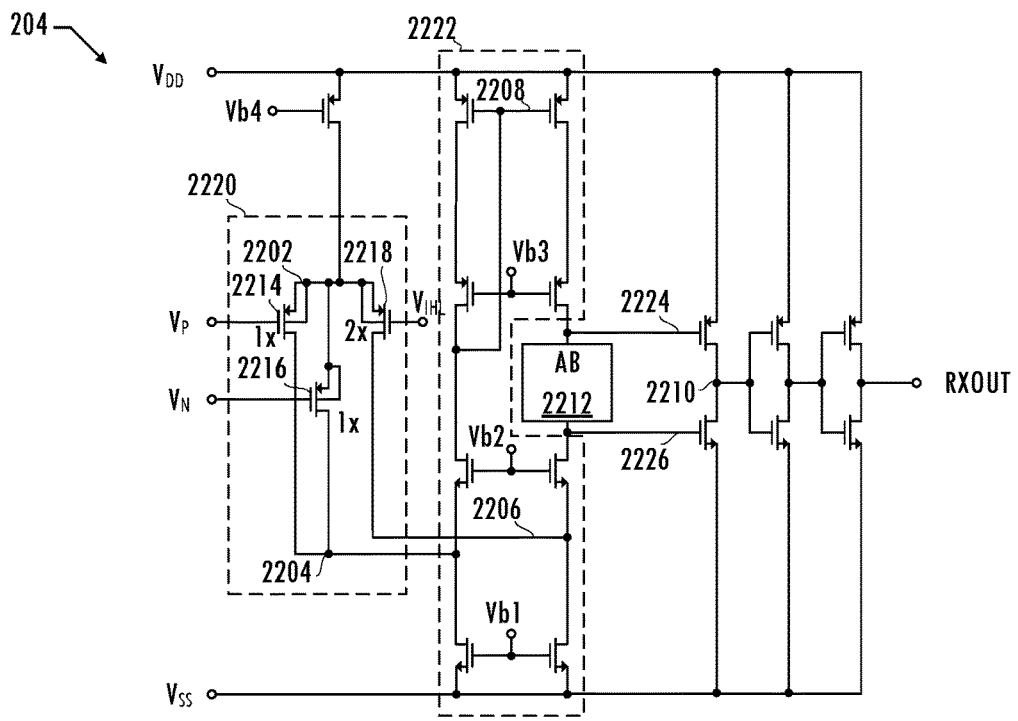
FIG. 21 illustrates a circuit diagram of an exemplary demodulator/detector of FIG. 6 consistent with at least one embodiment of the isolator product.

FIG. 21 illustrates a circuit diagram of demodulator/detector 204 consistent with at least one embodiment of an isolator product. Demodulator/detector 204 includes transistor 2214 and transistor 2216 that are configured as a winner-take-all extremum selector (e.g., a minimum selector). The transistor having the gate that sees the lesser of voltage of the differential pair of signals $V_N$ and $V_P$ is the winner, i.e., is configured as an active transistor. The other transistor will be inactive (i.e., off). The minimum selector forms one half of differential circuit 2220. As transistors 2214 and 2216 of differential circuit 2220 take turns selecting the minimum of the voltage levels of differential pair of signals $V_N$ and $V_P$, the effect on the output current of those transistors can be represented by the equivalent average signal that, if applied to an equivalent combined device forming half of the differential stage equal in size to transistor 2218, generates the same current through node 2204 at the drains of transistors 2214 and 2216.

Unlike conventional differential circuits, differential circuit 2220 has three transistor branches, with two of the three transistors configured as the minimum selector. Transistor 2218 forms the other half of differential circuit 2220 and has a size that is equal to a combination of the sizes of transistors 2214 and 2216. Transistor 2218 receives predetermined threshold voltage $V_{IHL}$ and generates a reference current that represents predetermined threshold voltage $V_{IHL}$. The output current at node 2204 has the carrier signal removed and is representative of the minimum signal of differential pair of signals $V_P$ and $V_N$. Current through node 2204 and the reference current through node 2206 enter into folded cascode circuit 2222. The greater of those two currents will determine the value of output signal RXOUT. Either the reference current that represents predetermined threshold voltage $V_{IHL}$ or the current that represents the minimum signal of differential pair of signals $V_P$ and $V_N$ wins and determines output signal RXOUT. For example, if the received on-off keying modulated signal is 'ON' (i.e., the carrier signal is present), and if predetermined threshold voltage $V_{IHL}$ is properly selected, then the current through node 2204 is greater than the current through node 2206 and determines output signal RXOUT (i.e., output signal RXOUT has a value of logic '1'). If the on-off keying modulated signal is 'OFF' (i.e., the carrier signal is not present), then the reference current through node 2206 is greater than the current through node 2204 and determines output signal RXOUT (i.e., output signal RXOUT has a value of logic '0').

Figure 22:
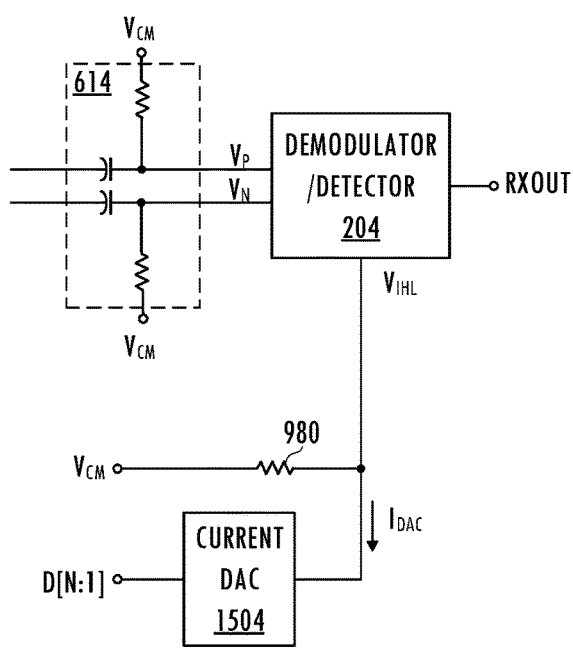
FIG. 22 illustrates a circuit diagram of a high-pass filter and demodulator/detector of FIG. 5 consistent with at least one embodiment of the isolator product.

Referring to FIG. 22, in at least one embodiment, demodulator/detector 204 receives predetermined threshold voltage $V_{IHL}$. Predetermined threshold voltage $V_{IHL}$ is generated using a current output digital-to-analog converter that sinks DC current $I_{DAC}$ having a level that is based on digital code D[N:1]. Although any number of bits can be used, an embodiment of current output digital-to-analog converter 1504 uses five bits (i.e., N=5). Since current output digital-to-analog converter 1504 is coupled to a high impedance node of demodulator/detector 204, DC current $I_{DAC}$ does not flow into demodulator/detector 204. Instead, DC current $I_{DAC}$ flows through offset resistor 980 and generates offset voltage $V_{OFFSET}$ across resistor 980. DC current $I_{DAC}$ is sourced by the common mode voltage generator ($V_{IHL}=V_{CM}-I_{DAC}\times R_{980}$).

Figure 23:
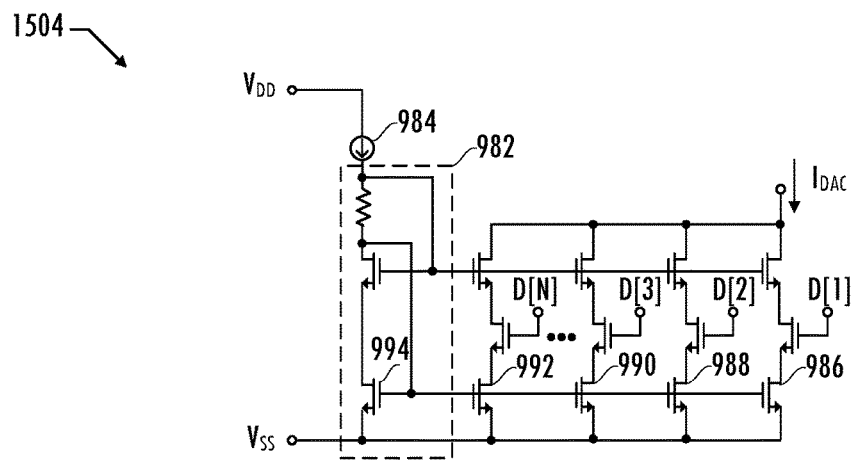
FIG. 23 illustrates a circuit diagram of a current output digital-to-analog converter for use with the demodulator/detector of FIG. 21 or FIG. 24 consistent with at least one embodiment of the isolator product.

An exemplary implementation of current output digital-to-analog converter 1504 is illustrated in FIG. 23. Current output digital-to-analog converter 1504 is a current source to ground (i.e., a current sink) implemented as a binary-weighted current mirror tree. Control code D[N:1] controls digital-to-analog converter 1504 and active high control signals correspond to binary values used to realize an equivalent number referred to herein as DN (i.e., $DN=\Sigma_{n=1}^{N}D[n]2^{n-1}$). Circuit 982 is a self-biased, wide-swing cascode mirror. Current 984 in circuit 982 is mirrored in digitally controlled mirror branches. Each branch is controlled by a corresponding transistor in response to a corresponding control bit of the digital code (e.g., stored in one-time programmable storage elements). If a respective transistor is on (i.e., D[n]='1' and the gate voltage is $V_{DD}$), then that respective branch conducts current and contributes to DC current $I_{DAC}$. If a respective transistor is off (i.e., D[n]='0' and the gate voltage is $V_{SS}$), then current does not flow through that respective branch and that respective branch does not contribute to DC current $I_{DAC}$. In at least one embodiment, transistors 986, 988, 990, and 992 are binary weighted. For example, the size of transistor 986 is $S_{986}$, the size of transistor 988 is $S_{988}$ and equals $2 \times S_{986}$, the size of transistor 990 is $S_{990}$ and equals $4 \times S_{986}$, the size of transistor 992 is $S_{992}$ and equals $2^{N-1} \times S_{986}$. Thus, DC current $I_{DAC} = DN \times I_{984} \times (S_{986}/S_{994})$, where $I_{984}$ is the current provided to circuit 982 by current source 984. In other embodiments, instead of implementing current output digital-to-analog converter 1504 as a sinking current digital-to-analog converter, a complementary circuit design implements current output digital-to-analog converter 1504 as a sourcing digital-to-analog converter using an array of p-type transistors that sources a selectable amount of current (i.e., DC current $I_{DAC}$) into an n-type current mirror. The n-type current mirror sinks a mirrored version of that current flowing from the common mode voltage generator to ground via offset resistor 980.

Referring to FIG. 21, folded cascode circuit 2222 provides a differential to single-ended conversion at node 2208. A static bias circuit provides bias voltages Vb1, Vb2, Vb3, and Vb4. Bias voltages Vb1 and Vb2 are wide-swing cascode bias voltages for a n-type folded cascode structure, bias voltage Vb3 is a cascode bias voltage for a p-type cascode structure, and bias voltage Vb4 is a simple mirror bias voltage. In at least one embodiment, demodulator/detector 204 includes Class AB control circuit 2212, which generates control signals for a push-pull output circuit. Class AB control circuit 2212 has a topology that provides speed and symmetrical delay characteristics to control signals on nodes 2224 and 2226. Thus, output signal RXOUT has a rise time that is the same as the fall time. If the current through transistor 2218 is greater than the combined current through node 2204, then the voltage on node 2206 will be higher than the voltage on node 2204. As a result, the voltages on nodes 2224 and 2226 increase, the output voltage on node 2210 decreases towards ground, and output signal RXOUT is low (i.e., a logic '0'), as in response to the differential pair of signals $V_N$ and $V_P$ having no carrier signal (i.e., $V_N = V_P = V_{CM}$ and $V_{IHL} = V_{CM} - V_{OFFSET}$ wins). If the current through transistors 2214 and 2216 of the minimum selector wins, then the voltage on node 2204 will be higher than the voltage on node 2206. As a result, the voltages on nodes 2224 and 2226 decrease, increasing the voltage on node 2210 to a high voltage level and output signal RXOUT is a high voltage level (i.e., a logic '1'), as in response to the voltage on the differential pair of signals $V_N$ and $V_P$ representing a carrier signal (i.e., $V_N = V_P = V_{CM} - V_{diffsignal}$ wins and $V_{IHL} = V_{CM} - V_{OFFSET}$).

Figure 24:
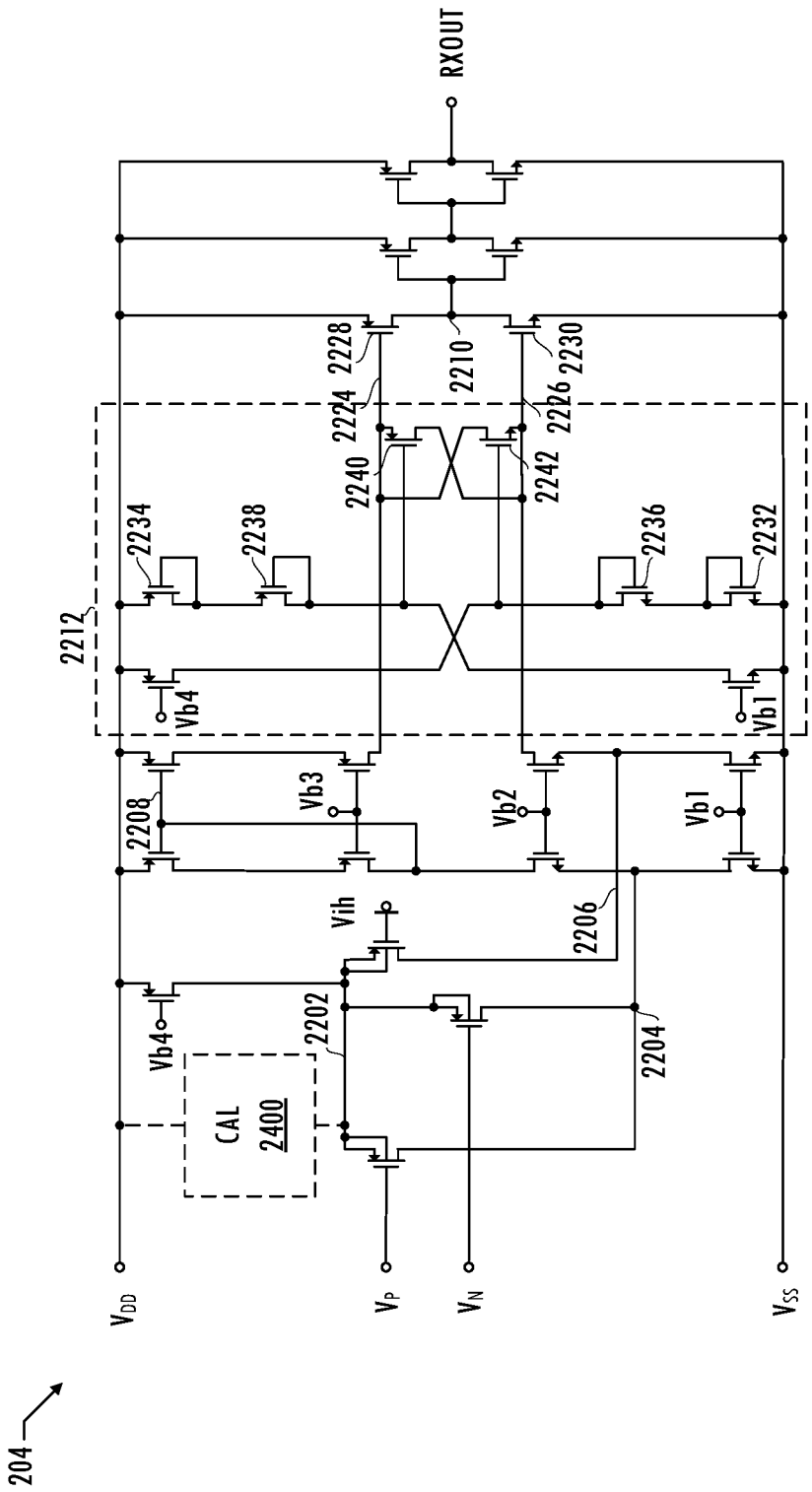
FIG. 24 illustrates a circuit diagram of a demodulator/detector of FIG. 5 including an exemplary control signal generator consistent with at least one embodiment of the isolator product.

Referring to FIG. 24, in at least one embodiment of demodulator/detector 204, class AB control circuit 2212 has a Monticelli topology that is fast and produces symmetrical delay characteristics. Transistors 2228, 2230, 2232, 2234, 2236, 2238, 2240, and 2242 have sizes $S_{2228}$, $S_{2230}$, $S_{2232}$, $S_{2234}$, $S_{2236}$, $S_{2238}$, $S_{2240}$, and $S_{2242}$, respectively, where $S_n = (W/L)_n$. Class AB control circuit 2212 maintains enough quiescent current at all conditions in transistors 2228 and 2230 to ensure enough gain, speed, and slewing capability of node 2210 under push transitions (e.g., node 2210 transitions to a high voltage level) or pull transitions (e.g., node 2210 transitions to a low voltage level). Thus, a fast demodulator/detector that has symmetrical propagation delay is disclosed.

Referring to FIG. 6, since receiver signal path 202 implements a bandpass filter effect, a target operating point includes a carrier frequency $f_c$ that results in a maximum gain, i.e., a highest amplitude signal that operating conditions allow at the input of demodulator/detector 204. Manufacturing process variations can cause the carrier frequency at which the maximum gain occurs to vary across multiple production lots of integrated circuits. Referring to FIG. 1, in at least one embodiment of isolator 104, integrated circuit die 106 includes an oscillator with a programmable frequency that is configured to generate the high frequency clock signal used as the carrier signal for on-off keying modulation of data for transmission. A technique identifies the frequency of the carrier signal that results in a high or maximum amplitude signal at the input to the demodulator/detector 204 and stores an indication of that frequency in memory of integrated circuit die 106 for use in programming the oscillator to generate a signal at that frequency.

Figure 25:
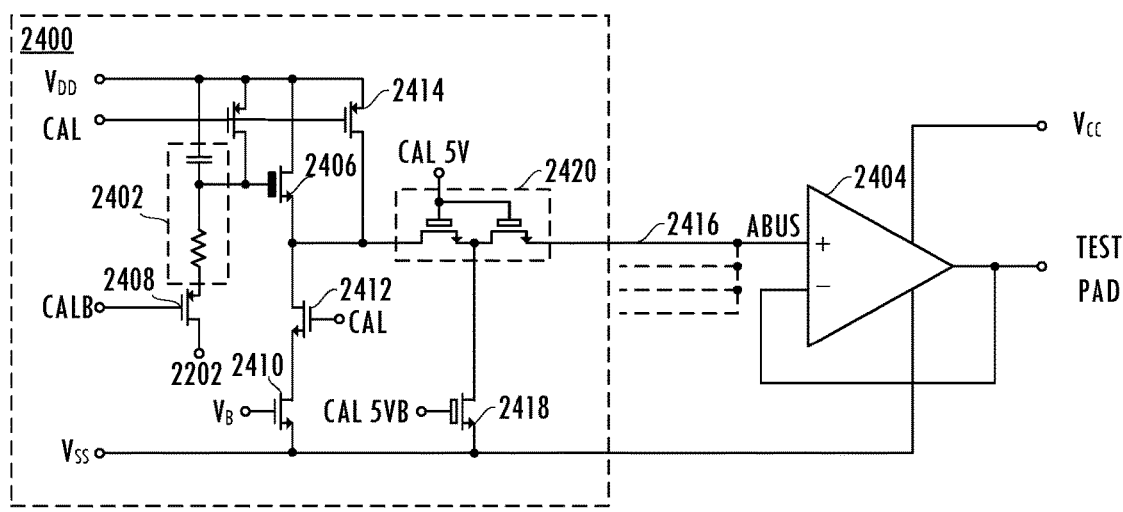
FIG. 25 illustrates a circuit diagram of an amplitude calibration circuit for use with the demodulator/detector of FIG. 5 consistent with at least one embodiment of the isolator product.

Referring to FIGS. 24 and 25, in at least one embodiment, a diagnostic technique for identifying the frequency of the carrier signal that results in a maximum or near-maximum signal level at the input to demodulator/detector 204 includes generating a diagnostic signal (e.g., an Analog Test Equipment (ATE)-compatible signal) that is proportional to the amplitude of a received signal at the input of demodulator/detector 204. By sweeping the frequency of the carrier signal and capturing the diagnostic signal generated by calibration circuit 2400 at frequency increments, the frequency of the carrier signal that results in the largest amplitude at the input of demodulator/detector 204 can be identified. In at least one embodiment, demodulator/detector 204 includes calibration circuit 2400 that generates a diagnostic signal that is driven on analog bus 2416 to an output terminal for use in determining carrier frequency $f_c$.

In at least one embodiment, calibration circuit 2400 includes filter 2402 that is selectively coupled to node 2202 via transistor 2408. Node 2202 is the tail node of the 3-branch differential circuit of demodulator/detector 204, as described above. In at least one embodiment, when in a diagnostic mode of operation, calibration control signal CAL is high, complementary calibration control signal CALB is low, and transistor 2408 conductively couples filter 2402 to node 2202 of demodulator/detector 204. Filter 2402 removes the carrier signal and drives transistor 2406, which is configured as a source follower. Transistor 2406 is configured as a uni-directional buffer stage outputting a copy of the signal on node 2202, while shielding node 2202 from external signals. In at least one embodiment transistor 2406 is a native metal-oxide-semiconductor transistor (as indicated by the transistor symbol with the filled, rectangular gate), which ensures sufficient voltage headroom, although in other embodiments, a standard transistor is used. A current source formed by transistor 2410 is selectively enabled by transistor 2412 in response to a high value of calibration control signal CAL. When calibration control signal CAL disables the current source, the source terminal of the transistor 2406 is pulled to $V_{DD}$ by transistor 2414. Calibration control signal CAL and calibration control signal CALB are $V_{DD}$-compatible versions of a calibration enable signal (i.e., CAL=$V_{DD}$ and CALB=0 V when calibration mode is enabled) and CAL5V and CAL5VB are $V_{CC}$-compatible (e.g., 5V compatible) versions of the calibration enable signal (i.e., CAL=$V_{CC}$ and CALB=0 V when calibration is enabled).

In an exemplary integrated circuit manufacturing process, a native transistor is a type of transistor that is between an enhancement mode transistor (i.e., a transistor that has a positive threshold voltage and no inverted channel formed at a zero gate-to-source voltage) and a depletion mode transistor (i.e., a transistor that has a zero to negative threshold voltage and an inverted channel formed at zero gate-to-source voltage). The native transistor has a threshold voltage of approximately 0 V. The native transistor may be an undoped transistor having a first conductivity type (e.g., n-type) manufactured directly in a substrate having a second conductivity type (e.g., p-type), whereas standard transistors are manufactured in a doped well that is formed in a substrate. The manufacturing process may provide transistors having different breakdown voltages and speeds of operation as a result of gate terminals formed using oxide layers of different thicknesses. An exemplary high voltage transistor has a thicker gate oxide and therefore has a higher breakdown voltage but is slower than a low voltage transistor that has a thinner gate oxide thickness.

A native transistor may be manufactured with oxide having a thin-gate oxide thickness (i.e., low-voltage native transistor) or a thick-gate oxide thickness (i.e., high-voltage native transistor). The native transistor is typically larger than a standard enhancement mode transistor (e.g., the native transistor may have a minimum length that is 3 to 6 times the minimum length of a standard transistor (high voltage or low voltage) having the same oxide thickness), and typically has a lower transconductance than a standard transistor. The low-voltage native transistor and the high-voltage native transistor have threshold voltages with magnitudes less than a threshold voltage of a standard transistor. In general, a native transistor has a threshold voltage of approximately 0V. The threshold voltage of the standard low-voltage transistor has a magnitude less than the threshold voltage of a standard high-voltage transistor. The high-voltage native transistor has a threshold voltage with a magnitude less than a threshold voltage of a high-voltage transistor. In an exemplary integrated circuit manufacturing process, the threshold voltage of the low-voltage transistor is at least 200 mV less than the threshold voltage of the high-voltage transistor (e.g., the threshold voltage of the low-voltage transistor is approximately 350-400 mV and the threshold voltage of the high-voltage transistor is approximately 600-650 mV).

When calibration control signals CAL, CALB, CAL5V, and CAL5VB enable calibration mode, transistor 2406 is conductively coupled to analog bus 2416 via transmission switch 2420 formed by high-voltage transistors. Test buffer 2404 drives the output signal externally to the integrated circuit via a test pad so that an external tester can measure the value of the signal on analog bus 2416. In at least one embodiment, analog bus 2416 and test buffer 2404 are shared with other circuits of integrated circuit die 108. Integrating calibration circuit 2400 into demodulator/detector 204 buffers internal nodes of demodulator/detector 204 from the analog bus 2416. During normal operation, the diagnostic mode is disabled, transmission switch 2420 is disabled and transistor 2418 is enabled. Any coupling from analog bus 2416 (e.g., via parasitic overlap capacitance of an n-type high-voltage transistor in transmission switch 2420) or transients on analog bus 2416 are shunted to ground via transistor 2418 and prevented from affecting demodulator/detector 204. The analog bus may be dedicated for the diagnostic functions described herein or may be incorporated with a test interface including selection circuitry for sharing analog bus 2416 with other diagnostic functions, as described in U.S. patent application Ser. No. 15/609,996, entitled "Test Interface with Access Across Isolation Barrier," naming Ernest T. Stroud, et al. as inventors, filed May 31, 2017, which application is incorporated by reference herein.

Referring to FIGS. 1, 22, 24, and 25, in at least one embodiment, calibration circuit 2400 is configured to generate a diagnostic signal that is used to determine a carrier frequency corresponding to a maximum amplitude signal at the input of demodulator/detector 204 and a target value for offset voltage $V_{OFFSET}$ or predetermined threshold voltage $V_{IHL}$. The diagnostic technique sets control code D[N:1] to zero to generate the predetermined threshold voltage $V_{IHL}$ to have a value of common mode voltage $V_{CM}$. As a result, the diagnostic signal on analog bus 2416 corresponds to a transmission of a logic '0' signal modulated using on-off keying modulation. Separately, the diagnostic technique enables transmission of the carrier signal by integrated circuit die 106 over isolation channel 120 and measures the diagnostic signal on analog bus 2416 driven externally as data corresponding to a transmission of a logic '1.' Integrated circuit die 106 is configured to increment the carrier frequency over a range of frequencies and corresponding data on analog test bus 2416 is measured externally. As transmission of the carrier signal for a particular frequency continues, the minimum selection output signal present on node 2202 generates a filtered average that drops to a steady state voltage for each frequency of the carrier frequency signal. The frequency of the carrier signal that corresponds to the maximum amplitude signal at the input of demodulator/detector 204 is identified from the data on analog bus 2416 (e.g., externally). That signal is indicated by the largest change in voltage level from a voltage level measured for a logic '0' signal. The corresponding offset voltage $V_{OFFSET}$ is determined by computing $0.5 \times (V_{ABUS1} - V_{ABUS0})$, where $V_{ABUS1}$ is the output voltage of the diagnostic signal on analog bus 2416 in response to a transmission of logic '1' at the carrier frequency corresponding to a maximum amplitude signal, and $V_{ABUS0}$ is the output voltage of the diagnostic signal on analog bus 2416 in response to transmission of logic '0'. A digital code corresponding to the value of offset voltage $V_{OFFSET}$ is programmed into integrated circuit die 108 for use by current output digital-to-analog converter 1504.

Figure 26:
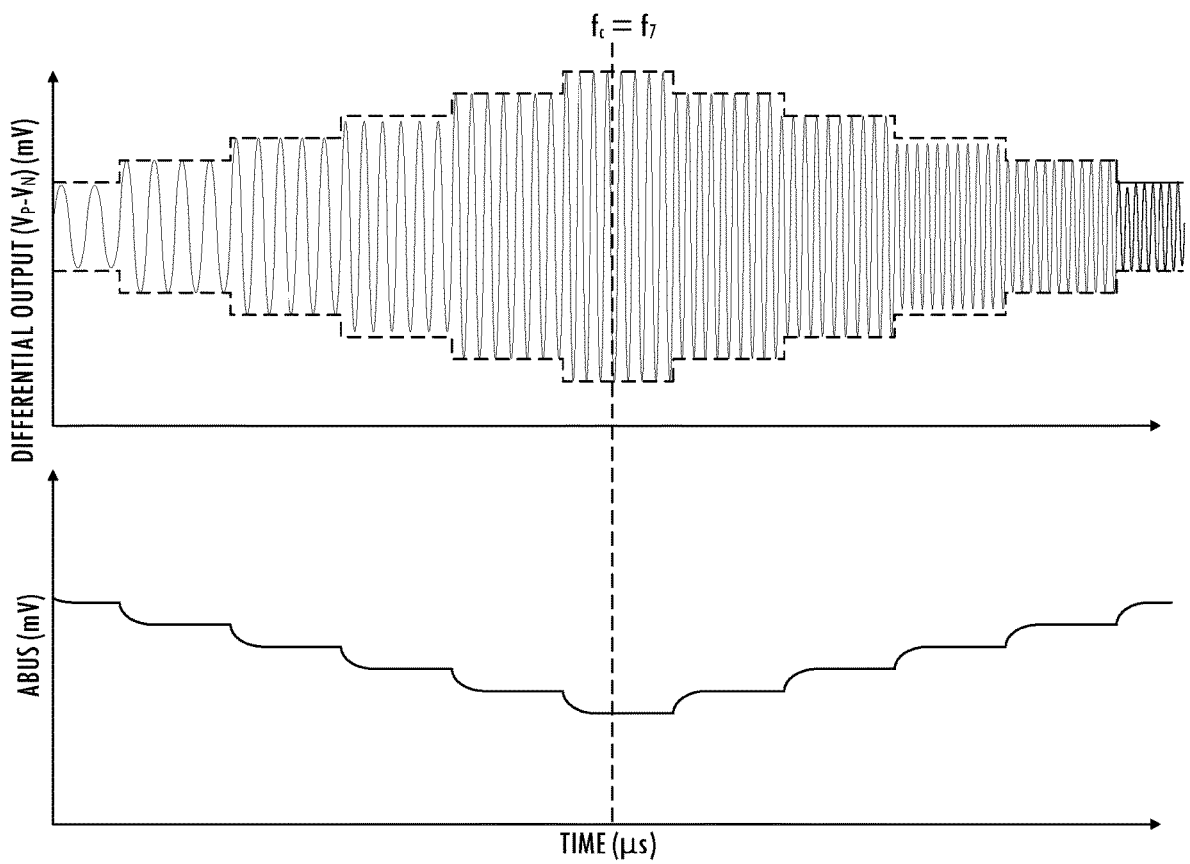
FIG. 26 illustrates waveforms for an exemplary differential input signal and single-ended output signal of the calibration circuit of FIG. 25 while sweeping a carrier frequency of an isolator product consistent with at least one embodiment of the isolator product.
Figure 27:
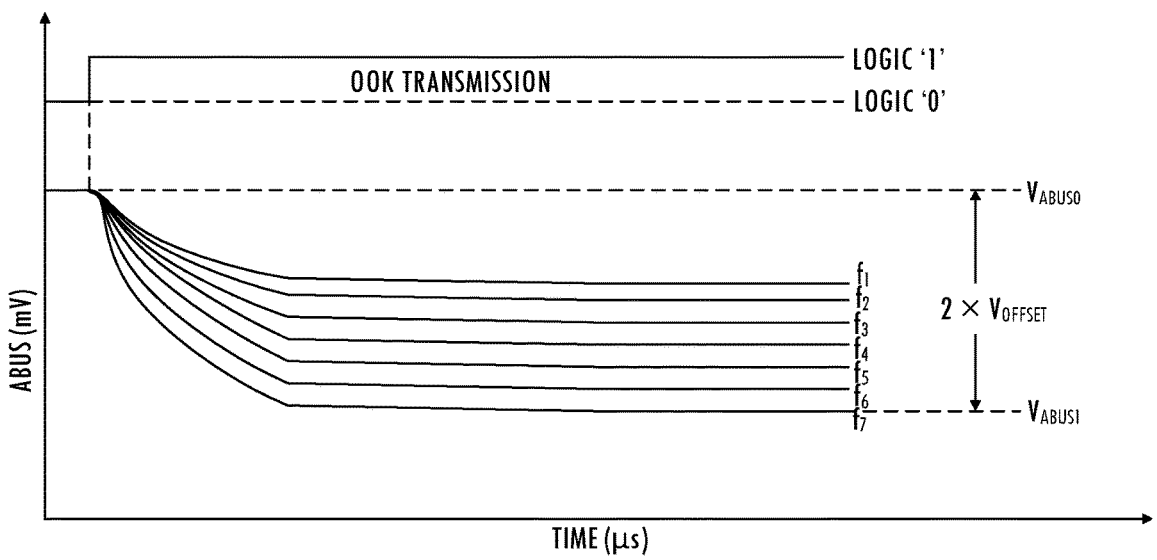
FIG. 27 illustrates waveforms for an exemplary single-ended output signal of the amplitude calibration circuit for various carrier frequencies of the isolator product consistent with at least one embodiment of the isolator product.

FIG. 26 illustrates exemplary waveforms for the amplitude of the signal on the differential pair of nodes $V_P$ and $V_N$ as carrier frequency $f_c$ is being incremented during a frequency sweep and a corresponding waveform of the output of the calibration circuit that is driven on the diagnostic bus to a terminal of the integrated circuit die 108. The minimum amplitude of diagnostic signal ABUS on analog bus 2416 corresponds to the maximum amplitude signal at the input of demodulator/detector 204. The corresponding carrier frequency $f_c$ and offset voltage $V_{OFFSET}$ are identified and stored in memory for use by the programmable oscillator and demodulator/detector 204, respectively. FIG. 27 illustrates voltage waveforms for an exemplary single-ended diagnostic signal ABUS of the calibration circuit for various carrier frequencies of the isolator product. After calibration, carrier frequency $f_c$ is set to frequency $f_7$ which corresponds to the maximum amplitude signal at the input of demodulator/detector 204 for the exemplary frequency sweep.

Thus, an isolation channel that reliably communicates information across an isolation barrier with selectable power consumption and immunity to common mode transients is disclosed. The description of the invention set forth herein is illustrative and is not intended to limit the scope of the invention as set forth in the following claims. For example, while the invention has been described in an embodiment in which an isolator product includes the receiver signal path, one of skill in the art will appreciate that the teachings herein can be utilized in other applications. The terms "first," "second," "third," and so forth, as used in the claims, unless otherwise clear by context, is to distinguish between different items in the claims and does not otherwise indicate or imply any order in time, location or quality. For example, "a first received network signal," "a second received network signal," does not indicate or imply that the first received network signal occurs in time before the second received network signal. Variations and modifications of the embodiments disclosed herein may be made based on the description set forth herein, without departing from the scope of the invention as set forth in the following claims.

What is claimed is:

1. A method for operating a receiver, the method comprising:
   configuring a receiver front-end circuit of the receiver according to a selected power consumption configuration; and
   adjusting a quiescent current of a programmable flat gain stage coupled to the receiver front-end circuit according to the selected power consumption configuration to compensate for any gain loss of the receiver front-end circuit in the selected power consumption configuration, the selected power consumption configuration being a reduced power consumption configuration and the programmable flat gain stage being configured to at least partially compensate for the gain loss of the receiver front-end circuit in the reduced power consumption configuration.

2. The method as recited in claim 1 further comprising:
   configuring a peaking gain stage of a variable peaking gain stage of the receiver according to the selected power consumption configuration; and
   configuring the programmable flat gain stage of the variable peaking gain stage of the receiver according to the selected power consumption configuration.

3. The method as recited in claim 1 wherein configuring power consumption of the receiver front-end circuit includes:
   adjusting a selectable resistance configured to realize a floating voltage source according to a selected value of a selectable power consumption; and
   adjusting a current according to the selected power consumption configuration.

4. The method as recited in claim 1 further comprising:
   receiving a received differential pair of signals using an input differential pair of nodes;
   amplifying the received differential pair of signals to generate a first amplified input signal using a first peaking gain stage of the receiver front-end circuit, the first peaking gain stage having a first frequency response including a first peak gain at or near a carrier frequency in a first pass band, the first peak gain occurring just prior to a first cutoff frequency of the first peaking gain stage; and
   amplifying the first amplified input signal to generate a differential output signal using a second peaking gain stage of the receiver front-end circuit, the second peaking gain stage having a high input impedance and a second frequency response including a second peak gain at or near the carrier frequency in a second pass band, the second peak gain occurring just prior to a second cutoff frequency of the second peaking gain stage, the first peaking gain stage and the second peaking gain stage having a cascaded peak gain at or near the carrier frequency.

5. The method as recited in claim 4 wherein amplifying the first amplified input signal includes:
   generating a unit current; and
   provide a programmable amount of unit current according to a selected value of a selectable power consumption.

6. The method as recited in claim 4 wherein amplifying the first amplified input signal includes:
   maintaining a self-biased point of a pair of cascode transistors during a common mode transient event.

7. A receiver comprising:
   a receiver front-end circuit configured according to a selected power consumption configuration; and
   a variable peaking gain stage including a programmable flat gain stage and a peaking gain stage, the programmable flat gain stage being configured to have a gain according to the selected power consumption configuration and the peaking gain stage being configured according to the selected power consumption configuration, the selected power consumption configuration being a reduced power consumption configuration and the programmable flat gain stage being configured to at least partially compensate for a gain loss of the receiver front-end circuit in the reduced power consumption configuration.

8. The receiver as recited in claim 7 wherein the programmable flat gain stage includes a current source configured according to the selected power consumption configuration to compensate for any gain loss of the receiver front-end circuit in the selected power consumption configuration.

9. The receiver as recited in claim 7
   wherein the receiver front-end circuit includes a selectable resistance configured to realize a floating voltage source according to a selected value of a selectable power consumption; and
   the receiver front-end circuit includes a selectable current source configured according to the selected value.

10. The receiver as recited in claim 7 wherein the receiver front-end circuit includes:
    a first peaking gain stage configured to amplify a received differential pair of signals received on an input differential pair of nodes, the first peaking gain stage having a first frequency response including a first peak gain at or near a carrier frequency in a first pass band, the first peak gain occurring just prior to a first cutoff frequency of the first peaking gain stage; and
    a second peaking gain stage configured to amplify a differential pair of signals generated by the first peaking gain stage, the second peaking gain stage having a high input impedance and a second frequency response including a second peak gain at or near the carrier frequency in a second pass band, the second peak gain occurring just prior to a second cutoff frequency of the second peaking gain stage,
    the first peaking gain stage and the second peaking gain stage having a cascaded peak gain at or near the carrier frequency.

11. The receiver as recited in claim 10 wherein the first peaking gain stage has a first selectable power consumption and the second peaking gain stage has a second selectable power consumption.

12. The receiver as recited in claim 11 wherein the first peaking gain stage includes:
a selectable resistance configured to maintain a predetermined voltage drop according to a selected value of the first selectable power consumption; and
a selectable current source coupled between the selectable resistance and a power supply node, the selectable current source configured to provide an amount of current according to the selected value of the first selectable power consumption.

13. The receiver as recited in claim 10 wherein the first peaking gain stage includes:
a virtual ground corresponding to a common mode voltage of the received differential pair of signals;
a floating voltage source coupled to the virtual ground; and
a symmetrical common-gate differential circuit coupled between the virtual ground and the input differential pair of nodes, the symmetrical common-gate differential circuit including:
a first half-circuit including first common-gate transistors coupled to a first node of the input differential pair of nodes; and
a second half-circuit including second common-gate transistors coupled to a second node of the input differential pair of nodes, the second half-circuit cross-coupled to the first half-circuit.

14. The receiver as recited in claim 13 wherein the first peaking gain stage further includes:
a current source configured to provide a first selectable current to the first half-circuit and configured to provide a second selectable current to the second half-circuit, the first selectable current and the second selectable current being selected according to a first selectable power consumption of the first peaking gain stage.

15. The receiver as recited in claim 13 wherein the first peaking gain stage further includes:
a first frequency-shaping active load circuit coupled between a first power supply node and a first output node of an output differential pair of nodes,
a second frequency-shaping active load circuit coupled between the first power supply node and a second output node of the output differential pair of nodes; and
cascode transistors coupled to the output differential pair of nodes, the floating voltage source, and the symmetrical common-gate differential circuit, the cascode transistors being biased relative to the virtual ground.

16. The receiver as recited in claim 10 wherein the second peaking gain stage includes:
a first frequency-shaping active load circuit coupled between a first power supply node and a first output node of a second output differential pair of nodes;
a second frequency-shaping active load circuit coupled between the first power supply node and a second output node of the second output differential pair of nodes; and
a telescopic differential stage including :
a differential pair of transistors coupled to a first output differential pair of nodes of the first peaking gain stage; and
a pair of cascode transistors coupled to the differential pair of transistors and to the second output differential pair of nodes of the second peaking gain stage,
a first cascode transistor of the pair of cascode transistors coupled to a first transistor of the differential pair of transistors and a second cascode transistor of the pair of cascode transistors coupled to a second transistor of the differential pair of transistors.

17. The receiver as recited in claim 16 wherein the second peaking gain stage further includes:
a first current source coupled between the first power supply node and the pair of cascode transistors and configured to provide a unit current; and
a selectable current source coupled between the differential pair of transistors and a power supply node, the selectable current source configured to provide a programmable amount of the unit current.

18. A receiver comprising:
means for configuring a receiver front-end circuit of the receiver according to a selected power consumption configuration; and
means for compensating for gain loss of the receiver front-end circuit in response to the selected power consumption configuration being a reduced power consumption configuration, the means for compensating including a programmable flat gain stage configured to at least partially compensate for the gain loss of the receiver front-end circuit in the reduced power consumption configuration.

* * * * *